(12) United States Patent
Takeoka et al.

(10) Patent No.: US 8,816,321 B2
(45) Date of Patent: Aug. 26, 2014

(54) NITRIDE SEMICONDUCTOR LIGHT-EMITTING DEVICE AND METHOD FOR PRODUCING THE SAME

(75) Inventors: Tadashi Takeoka, Osaka (JP); Yoshihiko Tani, Osaka (JP); Kazuya Araki, Osaka (JP); Yoshihiro Ueta, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 141 days.

(21) Appl. No.: 13/584,353

(22) Filed: Aug. 13, 2012

(65) Prior Publication Data

US 2013/0037779 A1 Feb. 14, 2013

(30) Foreign Application Priority Data

Aug. 12, 2011 (JP) ................. 2011-176987

(51) Int. Cl.
| | | |
|---|---|---|
| H01L 29/06 | (2006.01) | |
| H01L 33/02 | (2010.01) | |
| H01L 33/06 | (2010.01) | |
| H01L 33/32 | (2010.01) | |

(52) U.S. Cl.
CPC ............ *H01L 33/025* (2013.01); *H01L 33/06* (2013.01); *H01L 33/32* (2013.01)
USPC .............. 257/13; 257/11; 257/279; 257/605; 257/E33.008; 438/36; 438/44; 438/46; 438/767

(58) Field of Classification Search
None
See application file for complete search history.

(56) References Cited

U.S. PATENT DOCUMENTS

| | | |
|---|---|---|
| 6,657,234 B1 | 12/2003 | Tanizawa |
| RE42,008 E | 12/2010 | Tanizawa |
| 2005/0067613 A1 | 3/2005 | Kim |
| 2005/0285136 A1 | 12/2005 | Ou et al. |
| 2008/0054278 A9 | 3/2008 | Ou et al. |
| 2011/0198564 A1* | 8/2011 | Son ................................ 257/13 |
| 2011/0309327 A1* | 12/2011 | Jeong ............................ 257/13 |

FOREIGN PATENT DOCUMENTS

| | | |
|---|---|---|
| JP | 2000-349337 | 12/2000 |
| JP | 2005-109425 | 4/2005 |
| JP | 2005-277423 | 10/2005 |

OTHER PUBLICATIONS

A. Hangleiter, et al. (2005). "Suppression of Nonradiative Recombination by V-Shaped Pits in GaInN/GaN Quantum Wells Produces a Large Increase in the Light Emission Efficiency," Physical Review Letters 95:127402-4.

M. Shiojiri, et al. (2006). "Structure and formation mechanism of V defects in multiple InGaN/GaN quantum well layers," *Journal of Applied Physics* 99: 073505-6.

* cited by examiner

*Primary Examiner* — Yasser A Abdelaziez
(74) *Attorney, Agent, or Firm* — Morrison & Foerster LLP

(57) ABSTRACT

A nitride semiconductor light-emitting device includes an n-type nitride semiconductor layer, a V pit generation layer, an intermediate layer, a multiple quantum well light-emitting layer, and a p-type nitride semiconductor layer provided in this order. The multiple quantum well light-emitting layer is a layer formed by alternately stacking a barrier layer and a well layer having a bandgap energy smaller than that of the barrier layer. A V pit is partly formed in the multiple quantum well light-emitting layer, and an average position of starting point of the V pit is located in the intermediate layer.

10 Claims, 9 Drawing Sheets

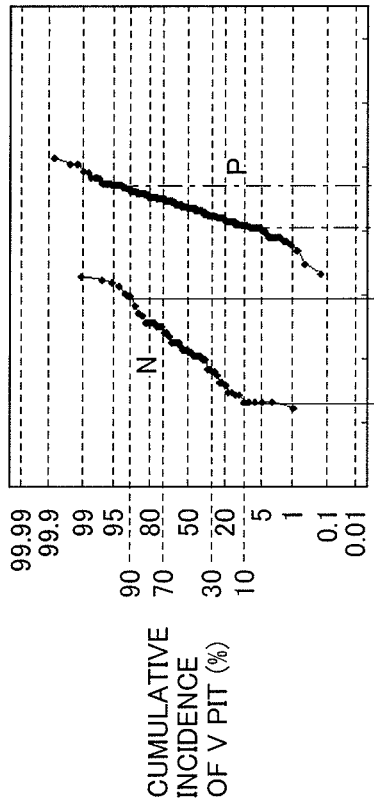
FIG.6A
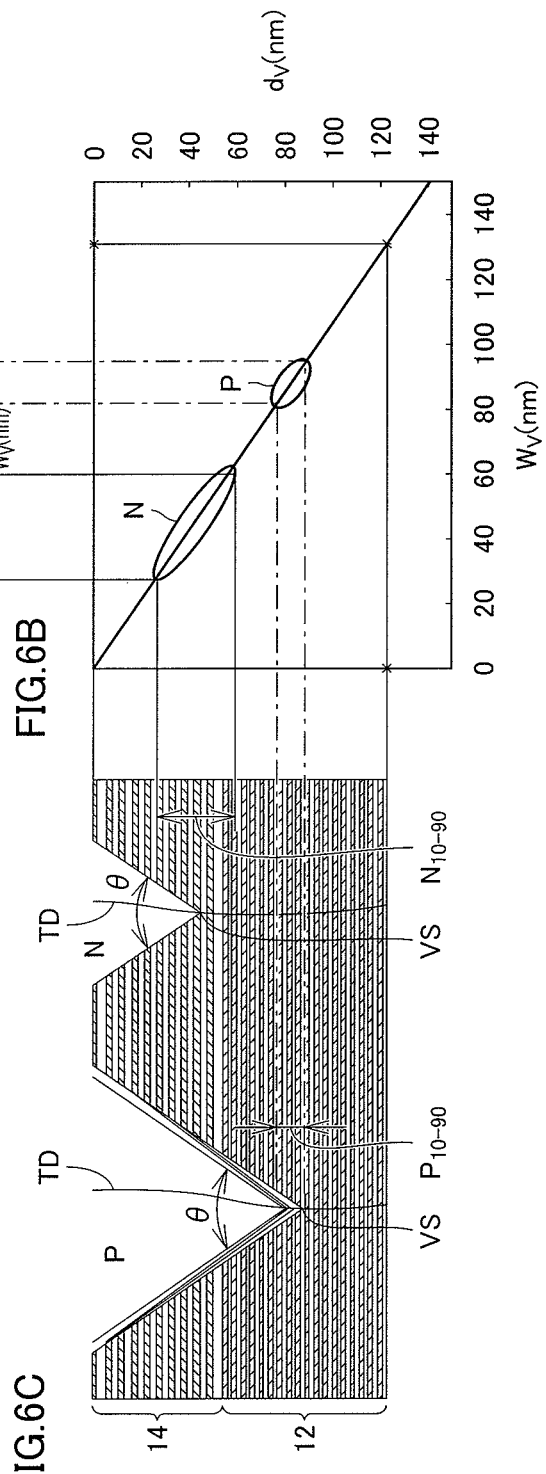
FIG.6B
FIG.6C

NITRIDE SEMICONDUCTOR LIGHT-EMITTING DEVICE AND METHOD FOR PRODUCING THE SAME This nonprovisional application is based on Japanese Patent Application No. 2011-176987 filed on Aug. 12, 2011 with the Japan Patent Office, the entire contents of which are hereby incorporated by reference.

BACKGROUND OF THE INVENTION

1. Field of the Invention

The present invention relates to a nitride semiconductor light-emitting device and a method for producing the same.

2. Description of the Background Art

A III-V group compound semiconductor containing nitrogen (hereinafter, referred to as "nitride semiconductor") has a bandgap energy corresponding to the energy of light having a wavelength in the infrared region to the ultraviolet region. Therefore, the nitride semiconductor is useful as a material for a light-emitting device that emits light having a wavelength in the infrared region to the ultraviolet region or a material for a light-receiving device that receives light having a wavelength in the infrared region to the ultraviolet region.

Further, binding between atoms constituting the nitride semiconductor is strong, dielectric breakdown voltage of the nitride semiconductor is high, and a saturation electron velocity of the nitride semiconductor is high. Due to these factors, a nitride semiconductor is useful as a material for an electronic device such as a high temperature-resistant and high-output high-frequency transistor.

Further, the nitride semiconductor will rarely harm the environment, and hence attracts attention as an easily-handled material.

In a nitride semiconductor light-emitting device using such a nitride semiconductor, a quantum well structure is generally employed as a light-emitting layer. When a voltage is applied, an electron and a hole are recombined in a well layer in the light-emitting layer, and as a result, light is generated. The light-emitting layer may have a single quantum well structure, or may have a multiple quantum well (MQW) structure where a well layer and a barrier layer are alternately stacked.

In the meantime, it is known that there is a defect in the form of a so-called V pit (V-shaped pit), V defect, or inverted hexagonal pyramid defect in a nitride semiconductor light-emitting device using a nitride semiconductor. For example, Japanese Patent Laying-Open No. 2005-277423 discloses a structure in which a "hexagonal pyramid cavity" is formed in a surface of a LED chip.

Since a V pit is a defect, it is generally supposed that characteristics of the LED will be improved by preventing generation of a V pit. On the other hand, in A. Hangleiter, F. Hitzel, C. Netzel, D. Fuhrmann, U. Rossow, G. Ade, and P. Hinze, "Suppression of Nonradiative Recombination by V-Shaped Pits in GaInN/GaN Quantum Wells Produces a Large Increase in the Light Emission Efficiency", Physical Review Letters 95, 127402 (2005), operation of a V pit (V-Shaped Pit) in a MQW light-emitting layer is reported. According to this, when a V pit exists in a MQW light-emitting layer, a quantum well width in the slant surface of the V pit is narrow. Therefore, an electron or a hole injected into the quantum well is prevented from reaching a threading dislocation which is a crystal defect inside the V pit, and as a result, non-light-emitting recombination in the MQW light-emitting layer is suppressed.

In M. Shiojiri, C. C. Chuo, J. T. Hsu, J. R. Yang and H. Saijo, "Structure and formation mechanism of V defects in multiple InGaN/GaN quantum well layers", JOURNAL OF APPLIED PHYSICS 99, 073505 (2006), it is reported that an apical angle of a V pit is ideally 56°.

As a technique of doping a light-emitting layer with a conductive impurity, Japanese Patent Laying-Open No. 2005-109425 discloses that an active layer (corresponding to the light-emitting layer in the present application) is formed by sequentially stacking an undoped GaN barrier layer and an n-type-impurity-doped InGaN quantum well layer. Also this publication discloses that a diffusion preventive film is provided at the interface where the undoped GaN barrier layer is in contact with the aforementioned InGaN quantum well layer, and that the diffusion preventive film contains an n-type impurity at a concentration lower than that in the InGaN quantum well layer.

Japanese Patent Laying-Open No. 2000-349337 discloses that the active layer contains an n-type impurity, and n-type impurity concentration in the active layer is higher in the n-layer side than in the p-layer side. Also this publication discloses that since n-type impurity concentration in the active layer is higher in the n-layer side than in the p-layer side, it is possible to supply a donor from the n-layer side to the active layer, and to obtain a nitride semiconductor device having high light emission output.

SUMMARY OF THE INVENTION

When a nitride semiconductor light-emitting device is produced according to the conventional techniques, and the produced nitride semiconductor light-emitting device is driven under a high temperature or at a large current, deterioration in light emission efficiency can be incurred. From this, deterioration in light emission efficiency per unit power (power efficiency) can also be incurred.

The present invention was devised in consideration of such a point, and it is an object of the present invention to provide a nitride semiconductor light-emitting device realizing excellent power efficiency because deterioration in light emission efficiency is suppressed even at the time of driving under a high temperature or at a large current.

A first nitride semiconductor light-emitting device according to the present invention includes an n-type nitride semiconductor layer, a V pit generation layer, an intermediate layer, a multiple quantum well light-emitting layer, and a p-type nitride semiconductor layer provided in this order. The multiple quantum well light-emitting layer is a layer formed by alternately stacking a barrier layer and a well layer having a bandgap energy smaller than that of the barrier layer. A V pit is partly formed in the multiple quantum well light-emitting layer, and an average position of starting point of the V pit is located in the intermediate layer.

A second nitride semiconductor light-emitting device according to the present invention includes an n-type nitride semiconductor layer, a V pit generation layer, an intermediate layer, a lower multiple quantum well light-emitting layer, an upper multiple quantum well light-emitting layer, and a p-type nitride semiconductor layer formed in this order. The upper multiple quantum well light-emitting layer is a layer formed by alternately stacking an upper barrier layer and an upper well layer having a bandgap energy smaller than that of the upper barrier layer. The lower multiple quantum well light-emitting layer is a layer formed by alternately stacking a lower barrier layer and a lower well layer having a bandgap energy smaller than that of the lower barrier layer, and at least the lower barrier layer is doped with an n-type impurity. An average n-type doping concentration of the lower multiple quantum well light-emitting layer is higher than an average n-type doping concentration of the upper multiple quantum well light-emitting layer. A V pit is partly formed in the upper multiple quantum well light-emitting layer, and an average position of starting point of the V pit is located in the intermediate layer or in the lower multiple quantum well light-emitting layer.

Preferably, n-type doping concentration in the V pit generation layer is significantly higher than n-type doping concentration in the uppermost surface of the n-type nitride semiconductor layer, and is preferably greater than or equal to $5 \times 10^{18}$ cm$^{-3}$.

Preferably, an In composition rate in the V pit generation layer is higher than an In composition rate in the uppermost surface of the n-type nitride semiconductor layer. At this time, the V pit generation layer preferably contains an n-type impurity, and composition of the V pit generation layer is preferably $In_xGa_{1-x}N$ ($0.1 \leq x \leq 0.2$).

Preferably, thickness of the V pit generation layer is greater than or equal to 5 nm.

Preferably, thickness of the intermediate layer is greater than or equal to 40 nm.

Preferably, the intermediate layer is a layer formed by alternately stacking a wide bandgap layer and a narrow bandgap layer having a bandgap energy smaller than that of the wide bandgap layer.

Preferably, the number of barrier layers in the upper multiple quantum well light-emitting layer is greater than or equal to 4.

A first method for producing a nitride semiconductor light-emitting device according to the present invention includes: a first step of forming an n-type nitride semiconductor layer, a second step of forming an intermediate layer on the n-type nitride semiconductor layer, a third step, conducted after the first step and before the second step, of stopping supply of a source gas to a wafer formed with the n-type nitride semiconductor layer and lowering the temperature of the wafer while supplying the wafer with a gas significantly containing $H_2$ gas as a carrier gas, and a fourth step of sequentially forming a multiple quantum well light-emitting layer and a p-type nitride semiconductor layer on the intermediate layer.

Preferably, the gas significantly containing $H_2$ gas contains greater than or equal to 20% by volume and less than or equal to 80% by volume of $H_2$ gas.

Preferably, the third step lowers the temperature of the wafer by more than or equal to 50° C.

By conducting the third step, preferably, a V pit is partly formed in the multiple quantum well light-emitting layer and an average position of starting point of the V pit is located in the intermediate layer.

The step of forming the multiple quantum well light-emitting layer preferably includes a step of alternately stacking a lower barrier layer and a lower well layer having a bandgap energy smaller than that of the lower barrier layer on the intermediate layer, and doping at least the lower barrier layer with an n-type impurity, to form a lower multiple quantum well light-emitting layer, and a step of alternately stacking an upper barrier layer and an upper well layer having a bandgap energy smaller than that of the upper barrier layer on the lower multiple quantum well light-emitting layer, to form an upper multiple quantum well light-emitting layer having an average n-type doping concentration lower than that in the lower multiple quantum well light-emitting layer. By conducting the third step, preferably, a V pit is partly formed in the multiple quantum well light-emitting layer and an average position of starting point of the V pit is located in the intermediate layer or in the lower multiple quantum well light-emitting layer.

A second method for producing a nitride semiconductor light-emitting device according to the present invention includes a step of forming, on an n-type nitride semiconductor layer, a V pit generation layer at a temperature significantly lower than that of the n-type nitride semiconductor layer, and a step of sequentially forming an intermediate layer, a multiple quantum well light-emitting layer, and a p-type nitride semiconductor layer on the V pit generation layer.

Preferably, the step of forming the V pit generation layer forms the V pit generation layer at a temperature lower than or equal to 920° C.

By formation of the V pit generation layer, preferably, a V pit is partly formed in the multiple quantum well light-emitting layer and an average position of starting point of the V pit is located in the intermediate layer.

Preferably, the step of forming the multiple quantum well light-emitting layer includes a step of alternately stacking a lower barrier layer and a lower well layer having a bandgap energy smaller than that of the lower barrier layer on the intermediate layer and doping at least the lower barrier layer with an n-type impurity, to form a lower multiple quantum well light-emitting layer, and a step of alternately stacking an upper barrier layer and an upper well layer having a bandgap energy smaller than that of the upper barrier layer on the lower multiple quantum well light-emitting layer, to form an upper multiple quantum well light-emitting layer having an average n-type doping concentration lower than that in the lower multiple quantum well light-emitting layer. By formation of the V pit generation layer, preferably, a V pit is partly formed in the multiple quantum well light-emitting layer and an average position of starting point of the V pit is located in the intermediate layer or in the lower multiple quantum well light-emitting layer.

Preferably, the step of forming the V pit generation layer forms the V pit generation layer having a thickness of greater than or equal to 5 nm.

Preferably, the step of forming an intermediate layer forms the intermediate layer having a thickness of greater than or equal to 40 nm.

Preferably, the step of forming an intermediate layer forms the intermediate layer by alternately stacking a wide bandgap layer and a narrow bandgap layer having a bandgap energy smaller than that of the wide bandgap layer.

Preferably, the step of forming an upper multiple quantum well light-emitting layer forms the upper multiple quantum well light-emitting layer so that the number of upper barrier layers is greater than or equal to 4.

According to the nitride semiconductor light-emitting device of the present invention, even at the time of driving under a high temperature or at a large current, light emission efficiency is prevented from deteriorating, so that the power efficiency is good.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6A is a graph showing a relationship between V pit diameter $W_v$ and cumulative incidence of V pit in one example of the present invention. FIG. 6B is a graph showing a relationship between V pit diameter $W_v$ and V pit depth $d_v$ obtained based on the result of FIG. 6A. FIG. 6C is a sectional view showing a positional relationship between the V pit generation layer and the starting point of the V pit determined based on the result shown in FIG. 6A.

DESCRIPTION OF THE PREFERRED EMBODIMENTS

In the following, embodiments of the present invention will be described with reference to drawings.

In the following, "barrier layer" indicates a layer sandwiched between well layers. A layer that is not sandwiched between well layers is indicated by "first barrier layer" or "last barrier layer" different from layers sandwiched between well layers.

Figure 1:
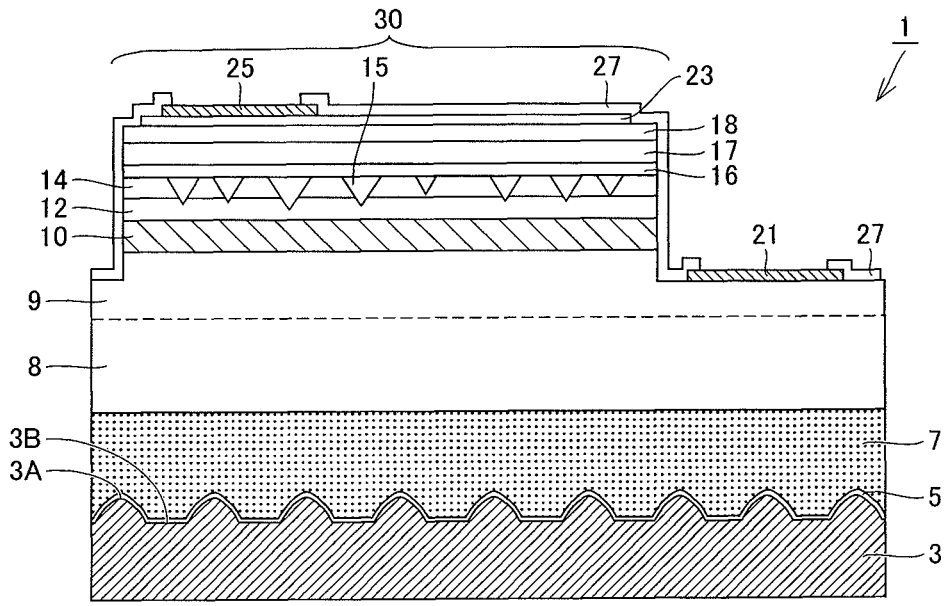
FIG. 1 is a sectional view showing a configuration of a nitride semiconductor light-emitting device according to one embodiment of the present invention.

In the following embodiments, the part shown in the lower side of FIG. 1 is sometimes expressed by "lower", while the part shown in the upper side of FIG. 1 is sometimes expressed by "upper" for indicating the positional relationship, however, this expression is used for the purpose of convenience, and differs from the "upper" and "lower" defined with respect to the gravity direction.

In the following, the term "doping concentration" and the term "carrier concentration" that means concentration of an electron or a hole generated in association with doping with an n-type impurity or a p-type impurity are used, and the relationship of these will be described later.

The "carrier gas" is a gas different from a source gas for a III group element, a source gas for a V group element and a source gas for a conductive impurity. An atom that forms the carrier gas will not be taken up into a film or the like.

The present invention is not limited to embodiments as shown below. Further, in the drawings of the present invention, dimensional relationships such as length, width and thickness are appropriately modified for clarification and simplification of the drawings, and do not represent actual dimensional relationships.

<First Embodiment>

Figure 2:
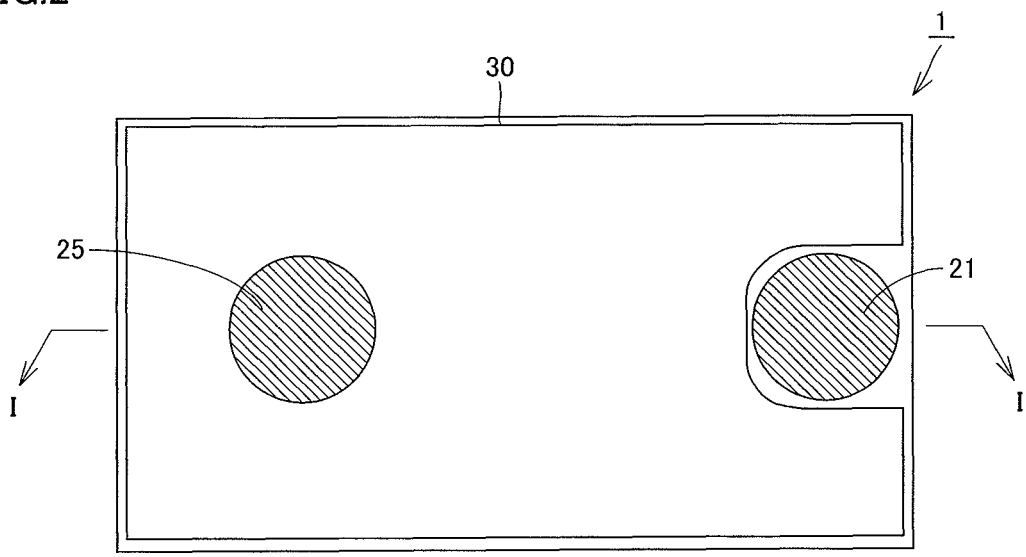
FIG. 2 is a plan view showing a configuration of a nitride semiconductor light-emitting device according to one embodiment of the present invention.
Figure 3:
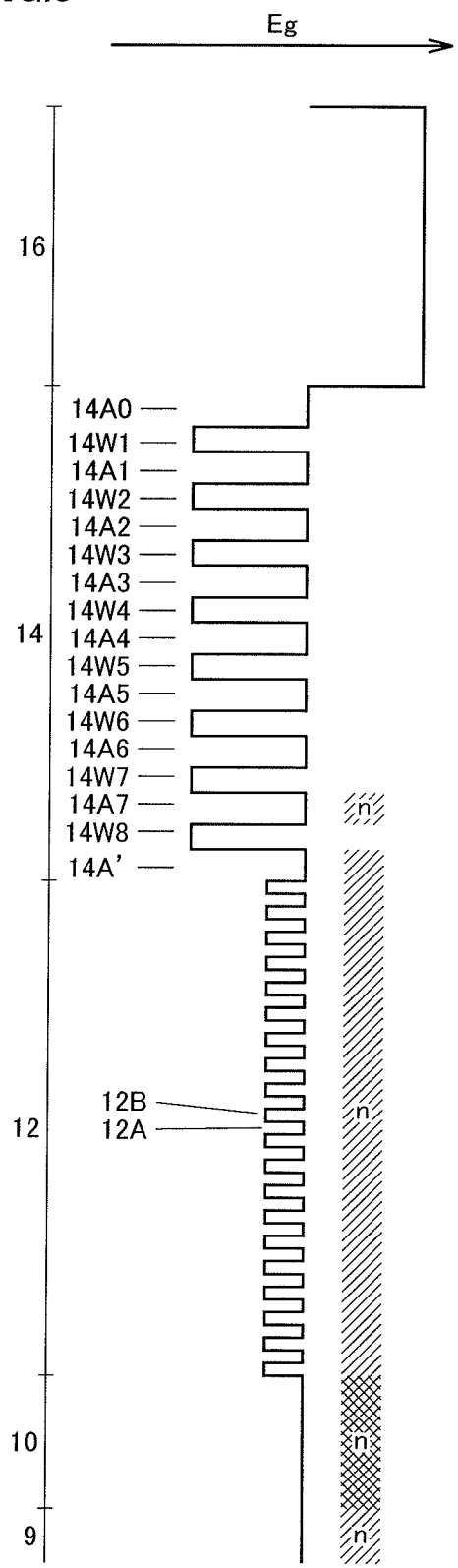
FIG. 3 is an energy chart schematically showing the magnitude of bandgap energy Eg in the nitride semiconductor layer forming the nitride semiconductor light-emitting device according to one embodiment of the present invention.

FIG. 1 and FIG. 2 respectively show a sectional view and a plan view of a nitride semiconductor light-emitting device 1 according to a first embodiment of the present invention. A sectional view along the line I-I shown in FIG. 2 corresponds to FIG. 1. Also, FIG. 3 is an energy chart schematically showing the magnitude of bandgap energy Eg from an n-type nitride semiconductor layer 9 to a p-type nitride semiconductor layer 16 in nitride semiconductor light-emitting device 1 shown in FIG. 1. The vertical direction in FIG. 3 is the up and down direction of the layer shown in FIG. 1, and Eg of the horizontal axis in FIG. 3 schematically represents the magnitude of bandgap energy in each composition. In FIG. 3, the layers doped with an n-type impurity are shaded.

<Nitride Semiconductor Light-Emitting Device>

In nitride semiconductor light-emitting device 1 according to the present embodiment, on an upper face of a substrate 3, a buffer layer 5, a base layer 7, n-type nitride semiconductor layers 8, 9, a V pit generation layer 10, a superlattice layer 12 serving as an intermediate layer disposed between V pit generation layer 10 and a MQW light-emitting layer 14, MQW light-emitting layer 14, and p-type nitride semiconductor layers 16, 17, 18 are stacked in this order to form a mesa part 30. Outside of mesa part 30, a part of an upper face of n-type nitride semiconductor layer 9 is not covered with V pit generation layer 10 and the like and exposed, and on this exposed part, an n-side electrode 21 is provided. On p-type nitride semiconductor layer 18, a p-side electrode 25 is provided with a transparent electrode 23 interposed therebetween. Almost whole of the upper face of nitride semiconductor light-emitting device 1 is provided with a transparent protection film 27 so that p-side electrode 25 and n-side electrode 21 are exposed. In the nitride semiconductor light-emitting device, observation of the cross section under ultrahigh magnification STEM (Scanning Transmission Electron Microscopy) revealed inevitable generation of a V pit, however, in the present embodiment, generation of V pit 15 is controlled by inserting V pit generation layer 10 as will be described later.

<Substrate>

Substrate 3 may be an insulating substrate made, for example, of sapphire or the like, or may be a conductive substrate made of GaN, SiC, ZnO or the like. Preferably, thickness of substrate 3 at the time of growth is for example, 900 μm to 1200 μm. Preferably, thickness of substrate 3 of nitride semiconductor light-emitting device 1 is for example, greater than or equal to 50 μm and less than or equal to 300 μm without limited to 120 μm. The upper face of substrate 3 may be flat or may have a convexoconcave shape made up of a projecting portion 3A and a recess portion 3B as shown in FIG. 1.

<Buffer Layer>

Buffer layer 5 is preferably, for example, an $Al_{s0}Ga_{t0}N$ ($0 \leq s0 \leq 1$, $0 \leq t0 \leq 1$, $s0+t0 \neq 0$) layer, and more preferably an AlN layer or a GaN layer. A small part (0.5 to 2%) of N may be substituted by oxygen. As a result, buffer layer 5 is formed to extend in the normal direction of the growth face of substrate 3, and hence buffer layer 5 made up of an assembly of columnar crystals having uniform crystal grains is obtained.

Thickness of buffer layer 5 is not particularly limited, and is preferably greater than or equal to 3 nm and less than or equal to 100 nm, and more preferably greater than or equal to 5 nm and less than or equal to 50 nm.

<Base Layer>

Base layer 7 is preferably, for example, an $Al_{s1}Ga_{t11}In_{u1}N$ ($0 \leq s1 \leq 1$, $0 \leq t1 \leq 1$, $0 \leq u1 \leq 1$, $s1+t1+u1 \neq 0$) layer, and more preferably an $Al_{s1}Ga_{t1}N$ ($0 \leq s1 \leq 1$, $0 \leq t1 \leq 1$, $s1+t1 \neq 0$) layer, and further preferably a GaN layer. As a result, a crystal defect (such as dislocation) existing in buffer layer 5 is more likely to be looped near the interface between buffer layer 5 and base layer 7, and hence it is possible to prevent the crystal defect from being taken over to base layer 7 from buffer layer 5.

Base layer 7 may contain an n-type impurity. However, when base layer 7 does not contain an n-type impurity, excellent crystallinity of base layer 7 can be maintained. Therefore, it is preferred that base layer 7 does not contain an n-type impurity.

By increasing thickness of base layer 7, defects in base layer 7 are reduced. However, the effect of reducing defects in base layer 7 is saturated if thickness of base layer 7 is increased over a certain degree. From this, thickness of base layer 7 is preferably greater than or equal to 1 μm and less than or equal to 8 μm.

N-Type Nitride Semiconductor Layer

N-type nitride semiconductor layers 8, 9 are preferably, for example, an $Al_{s2}Ga_{t2}In_{u2}N$ ($0 \leq s2 \leq 1$, $0 \leq t2 \leq 1$, $0 \leq u2 \leq 1$, $s2+t2+u2 \approx 1$) layer doped with an n-type impurity, and more preferably an $Al_{s2}Ga_{1-s2}N$ ($0 \leq s2 \leq 1$, preferably $0 \leq s2 \leq 0.5$, more preferably $0 \leq s2 \leq 0.1$) layer doped with an n-type impurity.

The n-type impurity is not particularly limited, and is preferably Si, P, As, Sb or the like, and more preferably Si. This also applies to later-described individual layers.

The n-type doping concentration in n-type nitride semiconductor layers 8, 9 is not particularly limited, and is preferably less than or equal to $1 \times 10^{19}$ cm$^{-3}$.

Since the larger the thicknesses of n-type nitride semiconductor layers 8, 9, the more the resistances thereof reduce, thicknesses of n-type nitride semiconductor layers 8, 9 are preferably larger. However, as thickness of n-type nitride semiconductor layers 8, 9 increase, the cost rises. In view of this, thicknesses of n-type nitride semiconductor layers 8, 9 are preferably, but not particularly limited to, greater than or equal to 1 μm and less than or equal to 10 μm from the practical standpoint.

In Example 1 as will be described later, n-type nitride semiconductor layers 8, 9 are formed by two growing steps of once interrupting growth of an n-type GaN layer, and then allowing an identical n-type GaN layer to grow again. However, configuration of the n-type nitride semiconductor layer is not particularly limited. For example, by continuously forming n-type nitride semiconductor layer 8 and n-type nitride semiconductor layer 9, the n-type nitride semiconductor layer may be formed as a monolayer, or the n-type nitride semiconductor layer may have a laminate structure of greater than or equal to 3 layers. n-type nitride semiconductor layers 8, 9 may have the same composition, or different compositions. Also, n-type nitride semiconductor layers 8, 9 may have the same thickness or different thicknesses.

<V Pit Generation Layer>

V pit generation layer 10 is a layer for forming V pit 15 so that an average position of starting point of V pit 15 is located in a layer located on the side of n-type nitride semiconductor layer 9 (superlattice layer 12 in the present embodiment) than a layer effectively functioning as a light-emitting layer (MQW light-emitting layer 14 in the present embodiment). Here, the starting point of V pit 15 means the bottom part of V pit 15, and is "VS" shown in FIG. 6C as will be described later. Average position of starting point of V pit 15 means the position obtained by averaging the starting points of V pits 15 formed in MQW light-emitting layer 14 in the direction of thickness of the nitride semiconductor light-emitting device.

As one example, V pit generation layer 10 is a highly doped n-type GaN layer having a thickness of 25 nm. Here, the expression "highly doped" means that n-type doping concentration is significantly higher (for example, greater than or equal to 1.1 times, preferably greater than or equal to 1.4 times, and more preferably greater than or equal to 1.8 times) than that in n-type nitride semiconductor layer 9 located under V pit generation layer 10. Concretely, n-type doping concentration in V pit generation layer 10 is preferably greater than or equal to $5 \times 10^{18}$ cm$^{-3}$, more preferably greater than or equal to $7 \times 10^{18}$ cm$^{-3}$, and further preferably greater than or equal to $1 \times 10^{19}$ cm$^{-3}$.

When n-type doping concentration in V pit generation layer 10 is too high, the film quality of V pit generation layer 10 is deteriorated, and light emission efficiency in MQW light-emitting layer 14 formed on V pit generation layer 10 can be deteriorated. Therefore, n-type doping concentration in V pit generation layer 10 is preferably less than or equal to 10 times, and more preferably less than or equal to 3 times the n-type doping concentration in n-type nitride semiconductor layer 9.

Preferably, n-type doping concentration of V pit generation layer 10 is significantly higher (for example, greater than or equal to 1.1 times, preferably greater than or equal to 1.4 times, and more preferably greater than or equal to 1.8 times) than that in the uppermost surface of n-type nitride semiconductor layer 9.

As another example, V pit generation layer 10 is preferably an $Al_{s3}Ga_{t3}In_{u3}N$ ($0 \leq s3 \leq 1$, $0 \leq t3 \leq 1$, $0 \leq u3 \leq 1$, $s3+t3+u3 \approx 1$) layer doped with an n-type impurity, and more preferably an $In_{u3}Ga_{1-u3}N$ ($0 \leq u3 \leq 1$, preferably $0 \leq u3 \leq 0.5$, more preferably $0 \leq u3 \leq 0.15$) layer doped with an n-type impurity. As described above, when V pit generation layer 10 contains In, an In composition rate in V pit generation layer 10 is preferably higher than an In composition rate in n-type nitride semiconductor layer 9. This will be described in the second embodiment below.

Such V pit generation layer 10 preferably has a thickness of greater than or equal to 5 nm, and more preferably has a thickness of greater than or equal to 10 nm. By this, the effect of allowing generation of more V pits for the number of threading dislocations is obtained.

<Intermediate Layer (Superlattice Layer)>

An intermediate layer is provided between V pit generation layer 10 and MQW light-emitting layer 14, and in the present embodiment, the intermediate layer is superlattice layer 12.

The superlattice layer in this specification means a layer made up of a crystal lattice having a periodical structure longer than that of a basic unit lattice by alternately stacking very thin crystal layers. As shown in FIG. 3, in superlattice layer 12, a wide bandgap layer 12A and a narrow bandgap layer 12B are alternately stacked to form a superlattice structure, and its periodical structure is longer than a basic unit lattice of the semiconductor material forming wide bandgap layer 12A and a basic unit lattice of the semiconductor material forming narrow bandgap layer 12B. Here, superlattice layer 12 may form a superlattice structure by alternately stacking one or more semiconductor layers other than wide bandgap layer 12A and narrow bandgap layer 12B, wide bandgap layer 12A, and narrow bandgap layer 12B sequentially. Also, length of one period of superlattice layer 12 (the sum of layer thickness of wide bandgap layer 12A and layer thickness of narrow bandgap layer 12B) is smaller than length of one period of later-described MQW light-emitting layer 14, and concretely greater than or equal to 1 nm and less than or equal to 10 nm.

Each wide bandgap layer 12A is preferably, for example, an $Al_aGa_bIn_{(1-a-b)}N$ ($0 \leq a < 1$, $0 < b \leq 1$) layer, and more preferably a GaN layer.

Each narrow bandgap layer 12B is required to have, for example, a bandgap energy that is smaller than that of wide bandgap layer 12A, and is larger than respective bandgap energies of later-described well layers 14W. Narrow bandgap layer 12B is preferably $Al_aGa_bIn_{(1-a-b)}N$ ($0 \leq a < 1$, $0 < b \leq 1$), and more preferably $Ga_bIn_{(1-b)}N$ ($0 < b \leq 1$).

Preferably, at least one of each wide bandgap layer 12A and each narrow bandgap layer 12B contains an n-type impurity. This is because a drive voltage of the nitride semiconductor light-emitting device increases if both wide bandgap layer 12A and narrow bandgap layer 12B are undoped.

Respective number of layers of wide bandgap layer 12A and narrow bandgap layer 12B may be for example, 2 to 50 although 20 is shown in FIG. 3.

Superlattice layer 12 is a layer provided for improving characteristics of MQW light-emitting layer 14, and is not an essential constituent for nitride semiconductor light-emitting device 1. However, when superlattice layer 12 is provided between V pit generation layer 10 and MQW light-emitting layer 14, V pit generation layer 10 and MQW light-emitting layer 14 can be spaced from each other, so that it is possible to make an average position of starting point of V pit 15 not exist in MQW light-emitting layer 14 (at least in the upper part of MQW light-emitting layer 14). Therefore, in the present invention, it is preferred to provide superlattice layer 12 between V pit generation layer 10 and MQW light-emitting layer 14. Preferably, thickness of superlattice layer 12 is greater than or equal to 40 nm, more preferably, thickness of superlattice layer 12 is greater than or equal to 50 nm, and more preferably, thickness of superlattice layer 12 is greater than or equal to 60 nm.

<MQW Light-Emitting Layer (Multiple Quantum Well Light-Emitting Layer)>

V pit 15 is partly formed in MQW light-emitting layer 14. Here, the expression "V pit 15 is partly formed" means that V pits 15 are observed in dot-like pattern on the upper face of MQW light-emitting layer 14 under AFM, and the surface is not entirely covered with V pits. Preferably, number density of V pits 15 is greater than or equal to $1 \times 10^8$ cm$^{-2}$ and less than or equal to $1 \times 10^{10}$ cm$^{-2}$. Also in the conventional case, a V pit is formed in a MQW light-emitting layer, however, in this case, number density of V pits on the upper face of the MQW light-emitting layer is about less than $1 \times 10^8$ cm$^{-2}$.

As shown in FIG. 3, MQW light-emitting layer 14 has such a configuration that a barrier layer 14A (14A1, 14A2, . . . , 14A7) is sandwiched between well layers 14W (14W1, 14W2, . . . , 14W8) by alternately stacking well layer 14W and barrier layer 14A, and is provided on superlattice layer 12 with a first barrier layer 14A' being interposed therebetween. On well layer 14W1 at the position closest to p-type nitride semiconductor layer 16 among well layers 14W, a last barrier layer 14A0 is provided. For identifying each barrier layer 14A and each well layer 14W, these layers are numbered from p-type nitride semiconductor layer 16 toward superlattice layer 12, and indicated by well layer 14W1, barrier layer 14A1, well layer 14W2, barrier layer 14A2 and so on.

MQW light-emitting layer 14 may be formed by sequentially stacking one or more semiconductor layers that are different from barrier layer 14A and well layer 14W, barrier layer 14A, and well layer 14W. Length of one period of MQW light-emitting layer 14 (the sum of thickness of barrier layer 14A and thickness of well layer 14W) is preferably greater than or equal to 5 nm and less than or equal to 100 nm, for example.

Composition of each well layer 14W is adjusted in accordance with the emission wavelength required for the nitride semiconductor light-emitting device according to the present embodiment, and is, for example, preferably an $Al_cGa_dIn_{(1-c-d)}N$ ($0 \leq c < 1$, $0 < d \leq 1$) layer, and more preferably an $In_eGa_{(1-e)}N$ ($0 < e \leq 1$) layer not containing Al. However, when ultraviolet emission, for example, at less than or equal to 375 nm is conducted, Al is generally contained as appropriate so as to increase the band gap energy. Composition of well layers 14W is preferably identical, and by this, the wavelength of light emitted by recombination of an electron and a hole in well layers 14W can be made identical, and hence, an emission spectrum width of nitride semiconductor light-emitting device 1 is advantageously narrowed. Further, each well layer 14W on the upper side, for example, preferably does not contain a conductive impurity as much as possible (a source material of a conductive impurity is not introduced at the time of growth), and in this case, non-light-emitting recombination in each well layer 14W is unlikely to occur, and the light emission efficiency is excellent. Meanwhile, each well layer 14W in the lower side may contain an n-type impurity, and as a result of this, a drive voltage of the nitride semiconductor light-emitting device tends to decrease.

Thickness of well layers 14W is preferably, but not limited to, identical to each other. When thickness of well layers 14W is identical, the quantum level is also identical, and light is emitted at an identical wavelength by recombination of an electron and a hole in each well layer, so that the light emission spectrum width of nitride semiconductor light-emitting device 1 is advantageously made small. On the other hand, by intentionally making composition or thickness of well layers 14W different from each other, the light emission spectrum width of nitride semiconductor light-emitting device 1 can be made broad, and this is rather preferred for certain uses of the nitride semiconductor light-emitting device such as for lighting.

Thickness of each well layer 14W is preferably greater than or equal to 1 nm and less than or equal to 7 nm. If the thickness of each well layer 14W is outside of this range, light emission efficiency of the nitride semiconductor light-emitting device tends to decrease.

Respective compositions of each barrier layer 14A (14A1 to 14A7 shown in FIG. 3), first barrier layer 14A', and last barrier layer 14A0 preferably have a larger bandgap energy than each well layer 14W, and concretely, $Al_fGa_gIn_{(1-f-g)}N$ ($0 \leq f < 1$, $0 < g \leq 1$) is preferred, and $In_hGa_{(1-h)}N$ ($0 < h \leq 1$) not containing Al or $Al_fGa_gIn_{(1-f-g)}N$ ($0 \leq f < 1$, $0 < g \leq 1$) having a lattice constant that is made substantially coincident with that of well layer 14W is more preferred.

Thickness of each barrier layer 14A is preferably greater than or equal to 1 nm and less than or equal to 10 nm, and more preferably greater than or equal to 3 nm and less than or equal to 7 nm. The smaller the thickness of each barrier layer 14A, the more the driving voltage of the nitride semiconductor light-emitting device drops, and when thickness of each barrier layer 14A is made extremely small, light emission efficiency of the nitride semiconductor light-emitting device tends to deteriorate.

Thickness of last barrier layer 14A0 is preferably greater than or equal to 1 nm and less than or equal to 40 nm.

n-Type doping concentrations in each barrier layer 14A (14A1 to 14A7 shown in FIG. 3) and first barrier layer 14A' are not particularly limited. Preferably, among plural barrier layers 14A, lower barrier layer 14A is subjected to n-type doping, and upper barrier layer 14A is subjected to n-type doping at a lower concentration, or undoped. Each barrier layer 14A (14A1 to 14A7 shown in FIG. 3), first barrier layer 14A', and last barrier layer 14A0 may be subjected to intentional n-type doping, or a p-type impurity can be contained by heat diffusion at the time of growth of p-type nitride semiconductor layer 16, p-type nitride semiconductor layer 17, and p-type nitride semiconductor layer 18.

While the number of well layers 14W is not particularly limited, it can be, for example, greater than or equal to 2 and less than or equal to 20, preferably greater than or equal to 3 and less than or equal to 15, and more preferably greater than or equal to 4 and less than or equal to 12.

<P-Type Nitride Semiconductor Layer>

In the constitution shown in FIG. 1, while the p-type nitride semiconductor layer has a triple layer structure made up of p-type AlGaN layer 16, p-type GaN layer 17, and high-concentration p-type GaN layer 18, this constitution is merely one example, and in general, p-type nitride semiconductor layers 16, 17, 18 are preferably, for example, an $Al_{s4}Ga_{t4}In_{u4}N$ ($0 \le s4 \le 1$, $0 \le t4 \le 1$, $0 \le u4 \le 1$, $s4+t4+u4 \ne 0$) layer doped with a p-type impurity, and more preferably an $Al_{s4}Ga_{1-s4}N$ ($0 < s4 \le 0.4$, preferably $0.1 \le s4 \le 0.3$) layer doped with a p-type impurity.

The p-type impurity is, for example, but not particularly limited to, magnesium.

Carrier concentration in p-type nitride semiconductor layers 17, 18 is preferably greater than or equal to $1 \times 10^{17}$ cm$^{-3}$. Here, since an activation ratio of the p-type impurity is about 0.01, p-type doping concentration (different from carrier concentration) in p-type nitride semiconductor layer 17, 18 is preferably greater than or equal to $1 \times 10^{19}$ cm$^{-3}$. However, p-type doping concentration in p-type nitride semiconductor layer 16 near MQW light-emitting layer 14 may be lower than this.

Total thickness of p-type nitride semiconductor layers 16, 17 and 18 is preferably, but not particularly limited to, greater than or equal to 50 nm and less than or equal to 300 nm. By reducing the thickness of p-type nitride semiconductor layers 16, 17, 18, it is possible to reduce the heating time at the time of growth, and to suppress diffusion of a p-type impurity into MQW light-emitting layer 14.

<n-Side Electrode, Transparent Electrode, p-Side Electrode> n-Side electrode 21 and p-side electrode 25 are electrodes for supplying nitride semiconductor light-emitting device 1 with drive power. n-Side electrode 21 and p-side electrode 25 include exclusively a pad electrode portion in FIG. 2, however, an elongated projecting portion (branch electrode) for current diffusion may be connected to n-side electrode 21 and p-side electrode 25. Also under p-side electrode 25, an insulating layer for stopping injection of current may be provided, and by this, the quantity of light emission shielded by p-side electrode 25 is reduced. n-Side electrode 21 may be made up of, for example, a titanium layer, an aluminum layer and a gold layer stacked in this order, and preferably has a thickness of about 1 μm on the assumption of the strength at the time of conducting wire bonding to n-side electrode 21. p-Side electrode 25 is preferably made up of, for example, a nickel layer, an aluminum layer, a titanium layer and a gold layer stacked in this order, and preferably has a thickness of about 1 μm. Compositions of n-side electrode 21 and p-side electrode 25 may be identical. Transparent electrode 23 is preferably a transparent conductive film of, for example, ITO (Indium Tin Oxide), or IZO (Indium Zinc Oxide), and preferably has a thickness of greater than or equal to 20 nm and less than or equal to 200 nm.

<Starting Point of V Pit>

In nitride semiconductor light-emitting device 1 according to the present embodiment, as shown by V pit P shown in FIG. 6C as will be described later, starting points VS of most of the V pits do not exist in MQW light-emitting layer 14. That is, the position of starting point of V pit estimated from the distribution of V pit diameter shown in FIG. 6A has distribution P shown in FIG. 6B, and accordingly, starting points of a majority of V pits 15 are expected to exist in superlattice layer 12. Since generation of V pit 15 is believed to result from threading dislocation TD, many of threading dislocations TD are expected to exist inside V pit 15. In this manner, an electron and a hole injected into MQW light-emitting layer 14 are prevented from reaching inside V pit 15. Therefore, it is supposed that occurrence of non-light-emitting recombination is suppressed because an electron and a hole are captured by threading dislocation TD. Therefore, it is possible to prevent light emission efficiency of the nitride semiconductor light-emitting device from deteriorating. This is remarkable at the time of driving under a high temperature or at a large current.

More specifically, since transfer of an injection carrier (hole or electron) into the MQW light-emitting layer is active under a high temperature, so that the probability of the injection carrier to reach threading dislocation TD increases. However, in nitride semiconductor light-emitting device 1 according to the present embodiment, since many of threading dislocations TD existing in MQW light-emitting layer 14 are covered with V pit 15 (because many of threading dislocations exist inside V pit 15), non-light-emitting recombination in threading dislocation TD is suppressed. Therefore, deterioration in light emission efficiency under a high temperature can be prevented.

Further, since the starting point of V pit 15 is located on the lower side of MQW light-emitting layer 14, it is possible to increase the volume of MQW light-emitting layer 14 contributing to light emission by increasing the number of non-doped barrier layers. Therefore, deterioration in light emission efficiency at the time of driving at a large current can be prevented.

<Carrier Concentration and Doping Concentration>

A carrier concentration means a concentration of electron or hole, and is not determined only by an amount of the n-type impurity or an amount of the p-type impurity. Such a carrier concentration is calculated according to a result of capacitance versus voltage characteristic of nitride semiconductor light-emitting device 1, and indicates the carrier concentration in the condition that a current is not injected, and is a sum of carriers generated from an ionized impurity, a crystal defect serving as a donor, or a crystal defect serving as an acceptor.

However, n-type carrier concentration can be regarded as being almost identical to n-type doping concentration because an activation ratio of Si or the like which is an n-type impurity is high. Also, n-type doping concentration can be easily determined by measuring concentration distribution in the depth direction by SIMS (Secondary Ion Mass Spectrometry). Further, relative relationship (ratio) of doping concentration is substantially the same with relative relationship (ratio) of carrier concentration. From these, in claims of the present invention, definition is made by doping concentration that is actually easy to be measured. Then, by averaging n-type doping concentrations obtained by measurement, it is possible to obtain average n-type doping concentration.

<Method for Producing Nitride Semiconductor Light-Emitting Device>

On substrate 3, buffer layer 5, base layer 7, n-type nitride semiconductor layer 8, n-type nitride semiconductor layer 9, V pit generation layer 10, superlattice layer 12, MQW light-emitting layer 14, p-type nitride semiconductor layer 16, p-type nitride semiconductor layer 17, and p-type nitride semiconductor layer 18 are sequentially formed. Then, p-type nitride semiconductor layer 18, p-type nitride semiconductor layer 17, p-type nitride semiconductor layer 16, MQW light-emitting layer 14, superlattice layer 12, V pit generation layer 10, and n-type nitride semiconductor layer 9 are partly etched so that a part of n-type nitride semiconductor layer 9 is exposed. On the upper face of n-type nitride semiconductor layer 9 exposed by this etching, n-side electrode 21 is formed. Also on the upper face of p-type nitride semiconductor layer 18, transparent electrode 23 and p-side electrode 25 are sequentially stacked. Then, transparent protection film 27 is formed to cover transparent electrode 23 and lateral surface of each layer exposed by the etching as described above. Composition, thickness and so on of each layer are as described in the foregoing <Nitride semiconductor light-emitting device>.

<Method for Preparing V Pit Generation Layer>

As one example, a method of allowing V pit generation layer 10 to grow at a temperature lower than that for n-type nitride semiconductor layer 9 is recited. Concretely, the extent of lowering the growth temperature is preferably greater than or equal to 50° C., and more preferably greater than or equal to 100° C. In other words, the growth temperature of V pit generation layer 10 is preferably lower than or equal to 920° C., more preferably lower than or equal to 860° C., and further preferably lower than or equal to 820° C. Preferably, the growth temperature is greater than or equal to 600° C., and more preferably greater than or equal to 700° C. As a result of this, the effect of forming a V pit in V pit generation layer 10 increases, and V pit 15 is formed in MQW light-emitting layer 14.

When the growth temperature of V pit generation layer 10 is too low, film quality of V pit generation layer 10 decreases, so that light emission efficiency in MQW light-emitting layer 14 formed on V pit generation layer 10 can be deteriorated. Therefore, the extent of lowering the growth temperature is preferably less than or equal to 400° C., and more preferably less than or equal to 300° C.

As another example, a method of preparing V pit generation layer 10 by setting n-type doping concentration higher than that in n-type nitride semiconductor layer 9 is recited. The extent of increase in n-type doping concentration is as described in the foregoing <V pit generation layer>.

In the following, concrete examples of the present embodiment will be shown. The present embodiment is not limited to examples as shown below.

<Nitride Semiconductor Light-Emitting Device and V Pit Evaluation Structure in Example 1>

In the following, nitride semiconductor light-emitting device 1 according to Example 1 and a V pit evaluation structure prepared for examination thereof will be described along the production steps. Although there is slight difference between the production condition of the V pit evaluation structure and the production condition of the nitride semiconductor light-emitting device in Example 1, the production condition of nitride semiconductor light-emitting device 1 will be representatively described below.

First, a wafer formed from sapphire substrate 3 of 100 mm in diameter having an upper face convexoconcave-processed to have a projecting portion 3A and a recess portion 3B was prepared. In the plane, projecting portion 3A is arranged at a position of repeating an apex of a regular triangle at an interval of 2 μm. On the upper face of the same, buffer layer 5 formed of AlN was formed by a sputtering method.

Next, the wafer was put into a first MOCVD apparatus, and base layer 7 formed of undoped GaN was allowed to grow by a MOCVD method, and subsequently, n-type nitride semiconductor layer 8 formed of Si-doped n-type GaN was allowed to grow. At this time, thickness of base layer 7 was 4 μm, thickness of n-type nitride semiconductor layer 8 was 3 μm, and n-type doping concentration in n-type nitride semiconductor layer 8 was $6 \times 10^{18}$ cm$^{-3}$.

The wafer taken out of the first MOCVD apparatus was put into a second MOCVD apparatus, and the temperature of the wafer was set at 1050° C. (a value measured by a radiation thermometer) and n-type nitride semiconductor layer 9 was allowed to grow. N-type nitride semiconductor layer 9 is formed of n-type GaN having a doping concentration of $6 \times 10^{18}$ cm$^{-3}$, and has a thickness of 1.5 μm.

Subsequently, the temperature of the wafer was set at 820° C., and V pit generation layer 10 was allowed to grow. Concretely, Si-doped GaN layer having a thickness of 25 nm was allowed to grow so that n-type doping concentration was $1 \times 10^{19}$ cm$^{-3}$.

Subsequently, at a temperature of the wafer of 820° C., superlattice layer 12 serving as an intermediate layer was allowed to grow. Concretely, wide bandgap layer 12A formed of Si-doped GaN and narrow bandgap layer 12B formed of Si-doped InGaN were alternately allowed to grow in 20 cycles.

Thickness of each wide bandgap layer 12A was 1.75 nm, and n-type doping concentration in each wide bandgap layer 12A was $1 \times 10^{19}$ cm$^{-3}$.

Thickness of each narrow bandgap layer 12B was 1.75 nm, and n-type doping concentration in each narrow bandgap layer 12B was $1 \times 10^{19}$ cm$^{-3}$. Further, since the flow rate of TMI was adjusted so that the wavelength of the light emitted from the well layer by photoluminescence was 375 nm, composition of each narrow bandgap layer was $In_yGa_{1-y}N$ (y=0.04).

Next, the temperature of the wafer was lowered to 770° C. and MQW light-emitting layer 14 was allowed to grow. Concretely, referring to FIG. 3, eight layers of well layers 14W were grown by allowing barrier layer 14A and well layer 14W formed of InGaN to grow alternately.

Thickness of each barrier layer 14A was 4.6 nm, n-type doping concentration in first barrier layer 14A' and barrier layer 14A7 was $4.3 \times 10^{18}$ cm$^{-3}$, and other barrier layers 14A6, 14A5, . . . , 14A1 were undoped.

As well layer 14W, an undoped $In_xGa_{1-x}N$ layer (x=0.20) was allowed to grow using nitrogen gas as a carrier gas. Thickness of each well layer 14W was 3.25 nm. Also, composition x of In was set by adjusting the flow rate of TMI so that the wavelength of the light emitted from well layer 14W by photoluminescence was 448 nm.

Next, on uppermost well layer 14W1, 10 nm of last barrier layer 14A0 formed of an undoped GaN layer was allowed to grow. As to the V pit evaluation structure as will be described later, the growth is stopped at this point of time, and the surface condition is evaluated.

Next, the temperature of the wafer was raised to 1000° C., and on the upper face of last barrier layer 14A0, p-type $Al_{0.18}Ga_{0.82}N$ layer 16, p-type GaN layer 17 and p-type contact layer 18 were allowed to grow.

TMG (trimethyl gallium) was used as a source gas for Ga which is a III group source gas in MOCVD growth of each layer as described above, TMA (trimethyl aluminum) was used as a source gas for Al, TMI (trimethyl indium) was used as a source gas for In, $NH_3$ was used as a source gas for N which is a V group source gas, $SiH_4$ was used as a source gas for Si which is a source gas for a conductive impurity, and $Cp_2Mg$ was used as a source gas for Mg, however, other source materials used for MOCVD may be used without limited to the above. Concretely, TEG (triethyl gallium) may be used as a source material for Ga, TEA (triethyl aluminum) may be used as a source gas for Al, TEI (triethyl indium) may be used as a source gas for In, organic nitrogen compounds such as DMHy (dimethylhydradine) may be used as a source gas for N, and $Si_2H_6$ or organic Si may be used as a source gas for Si.

Then, p-type contact layer 18, p-type GaN layer 17, p-type AlGaN layer 16, MQW light-emitting layer 14, superlattice layer 12, V pit generation layer 10, and n-type nitride semiconductor layer 9 were partly etched so that a part of n-type nitride semiconductor layer 9 was exposed. On the upper face of n-type nitride semiconductor layer 9 exposed by this etching, n-side electrode 21 formed of Au was formed. Also, on the upper face of p-type contact layer 18, transparent electrode 23 formed of ITO and p-side electrode 25 formed of Au were sequentially formed. Also, transparent protection film 27 formed of $SiO_2$ was formed to mainly cover transparent electrode 23 and lateral surface of each layer exposed by the aforementioned etching.

The wafer was divided into chips of 380×420 μm in size, and a nitride semiconductor light-emitting device according to Example 1 was obtained.

The obtained nitride semiconductor light-emitting device was mounted on a TO-18 stem, and light output was measured without conducting resin sealing. When it was driven at 30 mA in an environment at 25° C., a light output P (25)=41.4 mW (dominant wavelength 450 nm) was obtained at a driving voltage of 3.0 V. When this device was driven at 30 mA in an environment at 80° C., a light output P (80)=41.1 mW was obtained. P (80)/P (25)=99.2%, and the light output was generally constant regardless of the temperature.

Further, when this nitride semiconductor light-emitting device was driven at 85 mA (large current) in an environment at 25° C., light output P (25)=101.8 mW (dominant wavelength 450 nm) was obtained at a driving voltage of 3.24 V. When this device was driven at 85 mA in an environment at 80° C., light output P (80)=101.5 mW was obtained. P (80)/P (25)=99.7%, and the light output was generally constant regardless of the temperature even at the time of driving at a large current.

Figure 4:
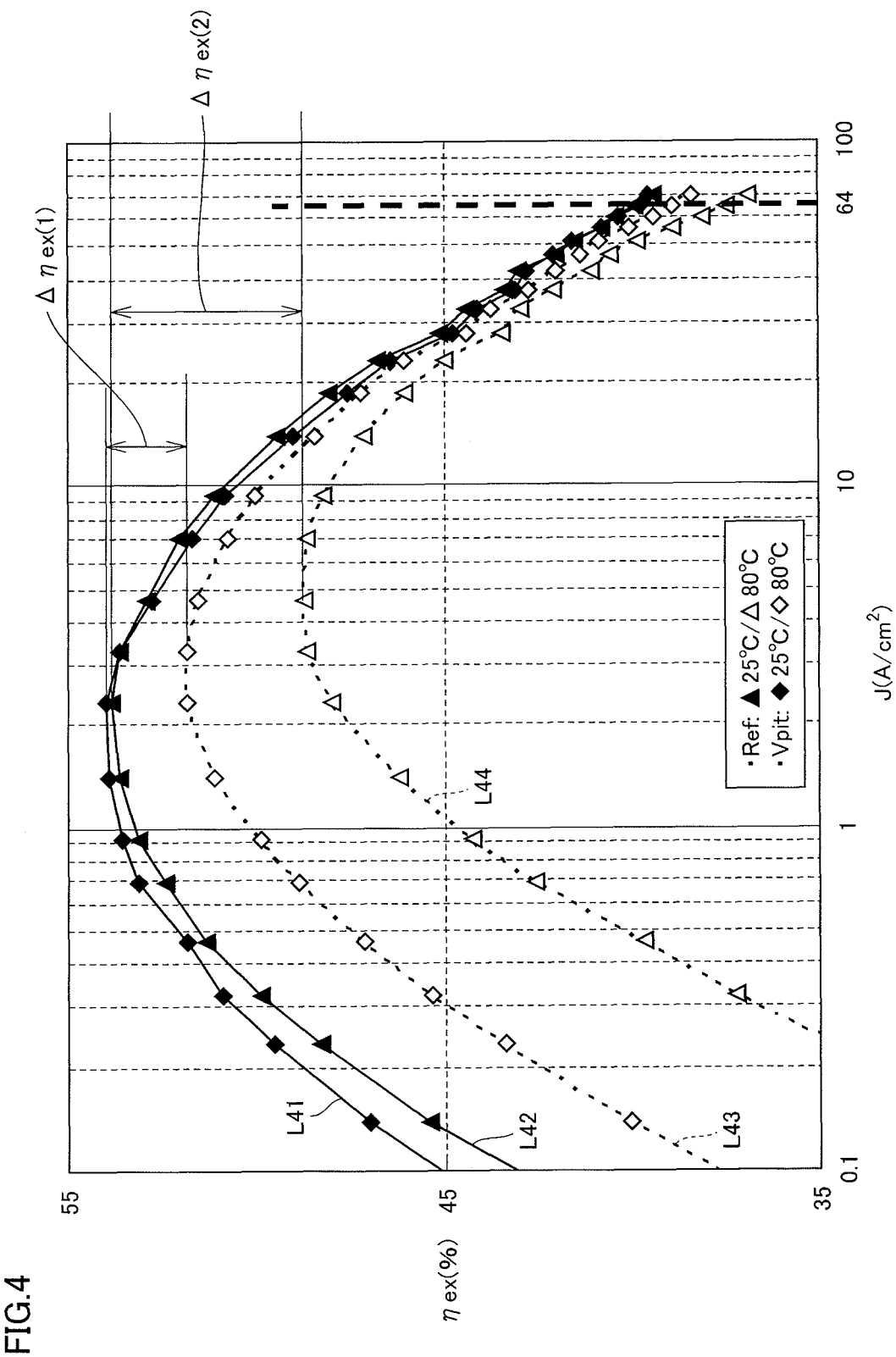
FIG. 4 is a graph showing a relationship between current density and external quantum efficiency in one example of the present invention.

For comparison, a nitride semiconductor light-emitting device (in the following, referred to as a nitride semiconductor device in Comparative Example 1) was prepared according to the same method as that of the nitride semiconductor light-emitting device according to Example 1 except that V pit generation layer 10 was not formed. FIG. 4 shows results of external quantum efficiency ηex plotted on the vertical axis, with respect to current density J on the horizontal axis, for the nitride semiconductor light-emitting device in Comparative Example 1 and for the nitride semiconductor light-emitting device according to Example 1.

Comparing at a current density of 64 A/cm², difference between external quantum efficiency ηex (solid diamond in FIG. 4, L41) of nitride semiconductor light-emitting device 1 according to Example 1 and external quantum efficiency ηex (solid triangle in FIG. 4, L42) of the nitride semiconductor light-emitting device in Comparative Example 1 was small at 25° C. On the other hand, at 80° C., difference between external quantum efficiency ηex of nitride semiconductor light-emitting device 1 according to Example 1 (open diamond in FIG. 4, L43) and external quantum efficiency ηex of the nitride semiconductor light-emitting device in Comparative Example 1 (open triangle in FIG. 4, L44) was large. Temperature dependency of external quantum efficiency was smaller in nitride semiconductor light-emitting device 1 according to Example 1 (solid diamond vs. open diamond) than in the nitride semiconductor light-emitting device in Comparative Example 1 (solid triangle vs. open triangle). Also difference in external quantum efficiency ηex at the current density where external quantum efficiency ηex peaks was smaller in nitride semiconductor light-emitting device 1 according to Example 1 (Δηex (1)) than in the nitride semiconductor light-emitting device in Comparative Example 1 (Δηex (2)).

As a fundamental experiment for achieving the present invention, inventors of the present invention prepared a V pit evaluation structure (V pit evaluation structure of Example 1) wherein growth is stopped at MQW light-emitting layer 14 and p-type AlGaN layer 16, p-type GaN layer 17 and p-type contact layer 18 are not allowed to grow, for observing the condition of V pit 15, and examined presence or absence of V pit generation layer 10 and the condition of V pit 15 using this V pit evaluation structure.

Figure 5A:
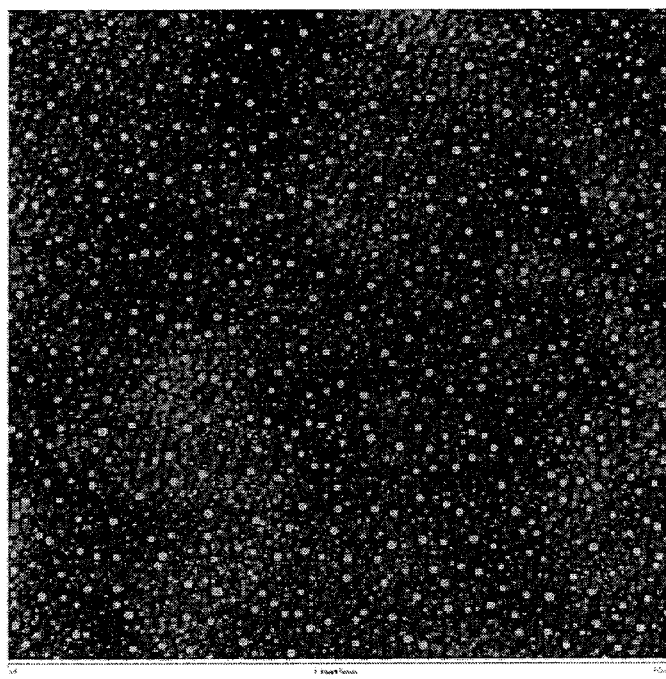
FIG. 5A is an image obtained by observing an upper face of a V pit evaluation structure in one comparative example under an AFM (Atomic Force Microscopy).
Figure 5B:
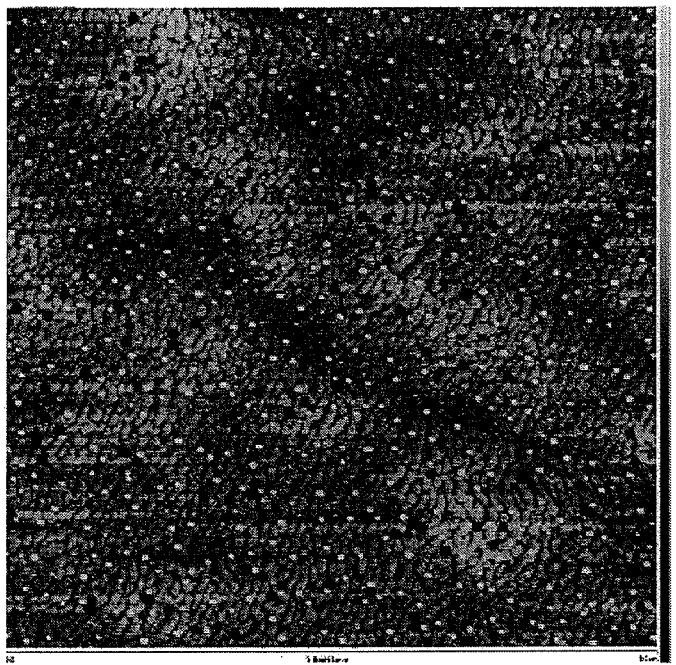
FIG. 5B is an image obtained by AFM observation of an upper face of a V pit evaluation structure in one example.

For comparison, a V pit evaluation structure (V pit evaluation structure of Comparative Example 1) wherein preparation of V pit generation layer 10 was omitted was prepared. Then, uppermost surface of each of the V pit evaluation structure of Example 1 and the V pit evaluation structure of Comparative Example 1 was observed under AFM. FIG. 5A is an image obtained by AFM observation of the uppermost surface of the V pit evaluation structure of Comparative Example 1, and FIG. 5B is an image obtained by AFM observation of the uppermost surface of the V pit evaluation structure of Example 1. The area of AFM observation is the area defined by a square of 5 μm in length and width in both cases.

A larger number of black points were observed in FIG. 5B than in FIG. 5A. These black points are V pits 15, and it can be seen that the number of V pits 15 significantly increased by V pit generation layer 10.

As a formation condition of V pit generation layer 10, inventors of the present invention employs the following two measures in Example 1 as described above: (i) setting n-type doping concentration higher than that in n-type nitride semiconductor layer 9 (n-type doping concentration in n-type nitride semiconductor layer 9 is $6\times10^{18}$ cm⁻³, and n-type doping concentration in V pit generation layer 10 is $1\times10^{19}$ cm⁻³), and (ii) setting a growth temperature lower than that of n-type nitride semiconductor layer 9 (the growth temperature of n-type nitride semiconductor layer 9 is 1050° C., and the growth temperature of V pit generation layer 10 is 820° C.). However, inventors of the present invention found that the effect as V pit generation layer 10 is realized only by one of the measures (i) and (ii) as described above. Concretely, the above (i) is as described in the above <V pit generation layer>, and the above (ii) is as described in the above <Method for preparing V pit generation layer>.

Inventors of the present invention also measured a V pit diameter in the surface of the V pit evaluation structure, and examined a positional relationship between V pit generation layer 10 and the starting point of V pit 15 based on the measurement result. As a result, it was found that the starting point of V pit 15 does not exist in V pit generation layer 10. In this regard, description will be made with reference to FIGS. 6A to 6C.

In FIG. 6A, the horizontal axis represents V pit diameter $W_v$ (nm) and the vertical axis represents cumulative incidence of V pit (%), and relationship between V pit diameter $W_v$ and cumulative incidence of V pit is plotted for structure P (structure into which V pit generation layer 10 is inserted (Example 1)) and for structure N (structure wherein preparation of V pit generation layer 10 is omitted (Comparative Example 1)). In FIG. 6A, vertical lines that passes through the point where cumulative incidence of V pit is 10% and the point where the incidence is 90% are drawn. As shown in FIG. 6A, $W_v$ of structure N (cumulative incidence of V pit 10% to 90%) was greater than or equal to 25 nm and less than or equal to 60 mm, and $W_v$ of structure P (cumulative incidence of V pit 10% to 90%) was greater than or equal to 82 nm and less than or equal to 95 nm. These demonstrate that V pit diameter $W_v$ is significantly larger in structure P than in structure N, and that variation in V pit diameter is much smaller in structure P than in structure N.

Further, using FIG. 6B, depth $d_v$ of V pit was determined using V pit diameter $W_v$. Here, depth of V pit $d_v$ was determined by using the fact that V pit diameter ($W_v$) and depth of V pit ($d_v$) satisfy the relationship of $W_v/2=d_v \times \text{Tan}(56°/2)$ when the angle of apex in the starting point of V pit (θ shown in FIG. 6C) is 56° (described in M. Shiojiri, C. C. Chuo, J. T. Hsu, J. R. Yang and H. Saijo, "Structure and formation mechanism of V defects in multiple InGaN/GaN quantum well layers", JOURNAL OF APPLIED PHYSICS 99, 073505 (2006)). This relationship coincides with the actual value measured by the STEM.

A schematic view of V pit P and V pit N represented by $d_v$ determined by FIG. 6B is shown in FIG. 6C. While V pit P and V pit N are depicted as if they were formed in the same sample in FIG. 6C, V pit P and V pit N will not actually be formed in the same sample, and are formed in different samples. In FIG. 6C, TD denotes threading dislocation, θ denotes an apex angle of V pit (56°), VS denotes a starting point of V pit, 12 denotes an intermediate layer, and 14 denotes a MQW light-emitting layer.

When V pit generation layer 10 exists, starting point VS of V pit P exists within the range represented by $P_{10-90}$, namely at the position of about 30 to 50 nm above the upper face of V pit generation layer 10, and in other words, exists in superlattice layer 12. On the other hand, when V pit generation layer 10 does not exist, starting point VS of V pit N exists within the range represented by $N_{10-90}$, namely in MQW light-emitting layer 14 or at the position of about 60 to 95 nm above the lower face of superlattice layer 12. As just described, when V pit generation layer 10 exists, deep V pit 15 can be formed. From these, it is preferred to provide V pit generation layer 10 and make thickness of superlattice layer 12 as an intermediate layer greater than or equal to 40 nm, because an average position of starting point VS of V pit 15 exists in superlattice layer 12. The range of thickness of superlattice layer 12 is as described in the above <Intermediate layer (superlattice layer)>.

Inventors of the present invention supposes the mechanism of improvement in characteristics by provision of V pit generation layer 10 as follows. When V pit generation layer 10 is inserted, starting point VS of V pit 15 is formed in superlattice layer 12, or in barrier layer 14A where an n-type impurity is doped on the lower side of MQW light-emitting layer 14. Threading dislocation TD that penetrates MQW light-emitting layer 14 from bottom to top is covered with V pit 15 in light-emitting layer 14 or in the part where barrier layer 14A is undoped. Under a high temperature, transfer of injection carrier (hole or electron) into MQW light-emitting layer 14 becomes active, and hence the probability of the injection carrier to reach threading dislocation TD increases. However, in the structure having V pit generation layer 10, since a majority of threading dislocations TD in MQW light-emitting layer 14 are covered with V pit 15 as described above, non-light-emitting recombination in threading dislocation TD is suppressed. Therefore, high temperature characteristic is improved (deterioration in light emission efficiency under a high temperature is prevented).

The configuration of V pit generation layer 10 is not limited to the configuration in the present embodiment, and may be, for example, a configuration as described in the following second embodiment. Also in this case, the same effect as that of the present embodiment can be obtained.

The configuration of MQW light-emitting layer 14 is not limited to the configuration in the present embodiment, and may be, for example, a configuration as described in the following third embodiment. Also in this case, the same effect as that of the present embodiment can be obtained.

Also, as shown in the following fourth embodiment, V pit 15 in the present embodiment may be formed in MQW light-emitting layer 14 without formation of V pit generation layer 10.

<Second Embodiment>

Figure 7:
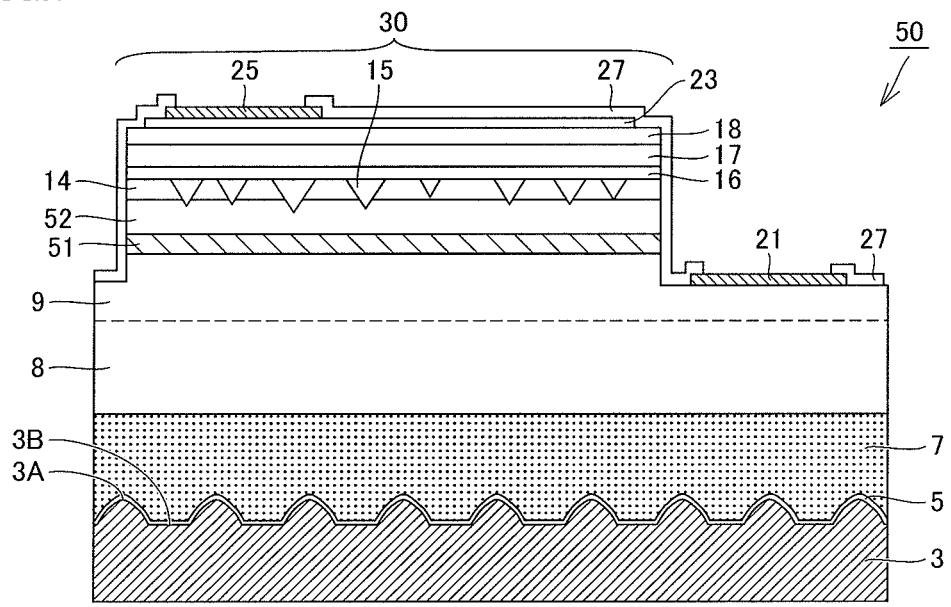
FIG. 7 is a sectional view showing a configuration of a nitride semiconductor light-emitting device according to one embodiment of the present invention.

FIG. 7 is a schematic sectional view of a nitride semiconductor light-emitting device 50 according to the second embodiment of the present invention. In the following, difference from the above first embodiment will be mainly described.

As shown in FIG. 7, nitride semiconductor light-emitting device 50 according to the present embodiment is formed by stacking, on an upper face of a substrate 3 formed with a projecting portion 3A and a recess portion 3B in the upper face, a buffer layer 5, a base layer 7, n-type nitride semiconductor layers 8, 9, a lower superlattice layer 51 functioning as a V pit generation layer, an upper superlattice layer 52 functioning as an intermediate layer, a MQW light-emitting layer 14, and p-type nitride semiconductor layers 16, 17, 18 in this order to form a mesa part 30. On the outside of mesa part 30, a part of an upper face of n-type nitride semiconductor layer 9 is exposed, and on this exposed part, an n-side electrode 21 is provided. On p-type nitride semiconductor layer 18, a p-side electrode 25 is provided with a transparent electrode 23 interposed therebetween. Almost whole of the upper face of nitride semiconductor light-emitting device 50 is provided with a transparent protection film 27 in such a manner that p-side electrode 25 and n-side electrode 21 are exposed. A constituting part similar to that in nitride semiconductor light-emitting device 1 is denoted by the same reference numeral.

Lower superlattice layer 51 functioning as a V pit generation layer is configured by alternately stacking a wide bandgap layer and a narrow bandgap layer. Respective compositions of the wide bandgap layer and the narrow bandgap layer are not particularly limited, and it suffices that bandgap energy of the wide bandgap layer is larger than bandgap energy of the narrow bandgap layer. For example, it suffices that the wide bandgap layer is formed of n-type GaN, and the narrow bandgap layer is formed of n-type $In_yGa_{1-y}N$ (0<y≤1). Concretely, lower superlattice layer 51 is formed by alternately stacking a wide bandgap layer formed of n-type GaN (thickness 1.75 nm) and a narrow bandgap layer formed of n-type $In_yGa_{1-y}N$ (thickness 1.75 nm, the value of y will be described later) in three cycles (having three narrow bandgap layers).

Preferably, an In composition rate in the narrow bandgap layer is higher than an In composition rate in n-type nitride semiconductor layer 9. As a result, the operation of lower superlattice layer 51 functioning as a V pit generation layer increases. Therefore, V pit 15 is partly formed in MQW light-emitting layer 14, and an average position of starting point of V pit 15 exists in upper superlattice layer 52. Preferably, the narrow bandgap layer of superlattice layer 51 has a higher In composition rate than the uppermost surface of n-type nitride semiconductor layer 9.

As a method for producing such lower superlattice layer 51, a method of varying the flow rate of the In source material so that the In composition rate in the narrow bandgap layer of lower superlattice layer 51 is higher than that in n-type nitride semiconductor layer 9 may be employed, or a method of forming at a lower temperature than that for n-type nitride semiconductor layer 9 without varying the flow rate of the In source material as will be described below may be employed.

While lower superlattice layer 51 is made up of a plurality of narrow bandgap layers in the above description, it may be formed of n-type $In_yGa_{1-y}N$ ($0.1 \leq y \leq 0.2$) which is a single narrow bandgap layer.

It suffices that thickness of lower superlattice layer 51 is greater than or equal to 1.75 nm, and it is more preferably greater than or equal to 5.25 nm, and further preferably greater than or equal to 8.75 nm.

Upper superlattice layer 52 is configured by alternately stacking a wide bandgap layer and a narrow bandgap layer. Respective compositions of the wide bandgap layer and the narrow bandgap layer are not particularly limited, and it suffices that bandgap energy of the wide bandgap layer is larger than bandgap energy of the narrow bandgap layer. Concretely, upper superlattice layer 52 is formed by alternately stacking a wide bandgap layer formed of Si-doped GaN (thickness 1.75 nm) and a narrow bandgap layer formed of Si-doped InGaN (thickness 1.75 nm) in 17 cycles.

In the following, concrete examples of the present embodiment will be described. It is to be noted that the present embodiment is not limited to the examples as shown below.

<V Pit Evaluation Structure in Examples 2-1 to 2-2>

After preparing n-type nitride semiconductor layer 9 according to the method shown in Example 1, lower superlattice layer 51 was prepared. While the flow rate of TMI which is a source material for In was not varied in Example 2-1, Example 2-2 and Comparative Example 2, lower superlattice layer 51 was prepared at 755° C. in Example 2-1, lower superlattice layer 51 was prepared at 705° C. in Example 2-2, and lower superlattice layer 51 was prepared at 835° C. in Comparative Example 2. As a result, In composition y of the narrow bandgap layer was 0.24 in Example 2-1, 0.36 in Example 2-2, and 0.04 in Comparative Example 2. The value of y is selected also from the view point of little light absorption of light emission wavelength as well as generation of V pit 15. In this sense, when the light emission wavelength is greater than or equal to 440 nm and less than or equal to 460 nm, it is considered that the above y is preferably greater than or equal to 0.02 and less than or equal to 0.2, and more preferably greater than or equal to 0.05 and less than or equal to 0.15.

Then, upper superlattice layer 52 was prepared according to the preparation method of intermediate layer (superlattice layer) 12 in Example 1, and MQW light-emitting layer 14 was prepared according to the method described in Example 1. In this manner, a V pit evaluation structure was obtained in Example 2-1, Example 2-2 and Comparative Example 2, and the upper face of the obtained V pit evaluation structure was observed under AFM.

As a result, in contrast to the number of V pits in the AFM observation area of 5 μm in length and width of 16 ($6.4 \times 10^7$ cm$^{-2}$) in Comparative Example 2, the number of V pits in the aforementioned area was 96 ($3.8 \times 10^8$ cm$^{-2}$) in Example 2-1 (growth temperature of superlattice layer 51 is 755° C.), and the number of V pits in the aforementioned area was 106 ($4.2 \times 10^8$ cm$^{-2}$) in Example 2-2 (growth temperature of superlattice layer 51 is 705° C.), and it was confirmed that the number density of V pits 15 was increased in Example 2-1 and Example 2-2 than in Comparative Example 2. It was also confirmed by TEM observation, that in Example 2-1 and Example 2-2, the starting point of V pit 15 is almost on the upper side of upper superlattice layer 52.

<Third Embodiment>

Figure 8:
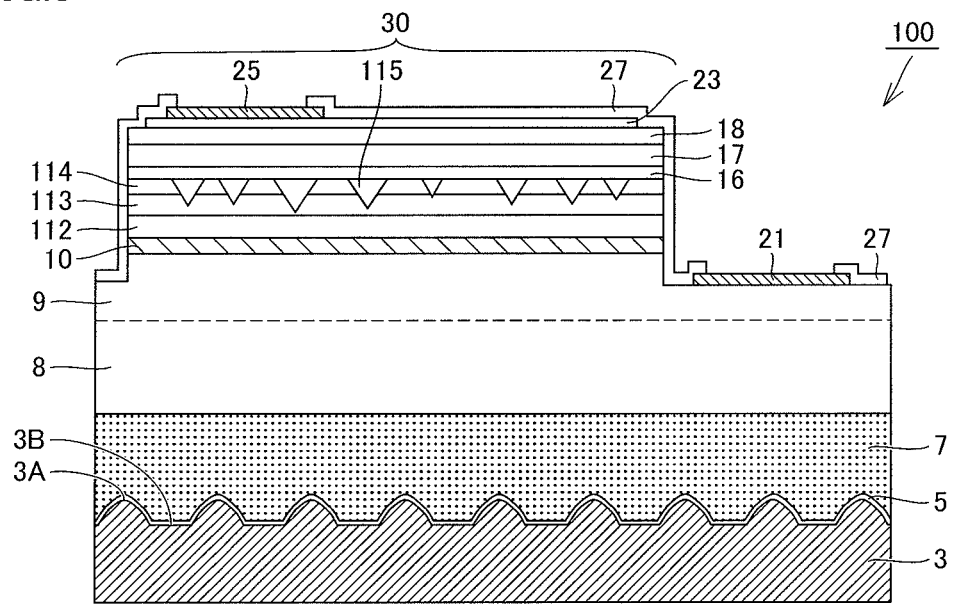
FIG. 8 is a sectional view showing a configuration of a nitride semiconductor light-emitting device according to one embodiment of the present invention.

FIG. 8 is a schematic sectional view of a nitride semiconductor light-emitting device 100 according to the third embodiment of the present invention. In the following, difference from the above first embodiment will be mainly described.

As shown in FIG. 8, nitride semiconductor light-emitting device 100 according to the present embodiment is formed by stacking, on an upper face of a substrate 3 formed with a projecting portion 3A and a recess portion 3B in the upper face, a buffer layer 5, a base layer 7, n-type nitride semiconductor layers 8, 9, a V pit generation layer 10, a superlattice layer 112 serving as an intermediate layer, a lower MQW light-emitting layer 113, an upper MQW light-emitting layer 114, and p-type nitride semiconductor layers 16, 17, 18 in this order to form a mesa part 30. On the outside of mesa part 30, a part of an upper face of n-type nitride semiconductor layer 9 is exposed without being covered with V pit generation layer 10 and superlattice layer 112, and on this exposed part, an n-side electrode 21 is provided. On p-type nitride semiconductor layer 18, a p-side electrode 25 is provided with a transparent electrode 23 interposed therebetween. Almost whole of the upper face of nitride semiconductor light-emitting device 100 is provided with a transparent protection film 27 in such a manner that p-side electrode 25 and n-side electrode 21 are exposed. A constituting part similar to that in nitride semiconductor light-emitting device 1 is denoted by the same reference numeral.

As described in the above first embodiment, superlattice layer 112 is formed by stacking a wide bandgap layer and a narrow bandgap layer.

While lower MQW light-emitting layer 113 less contributes to light emission in comparison with upper MQW light-emitting layer 114, it functions as a layer for maintaining crystal quality of upper MQW light-emitting layer 114 and is formed by stacking a lower barrier layer and a lower well layer. Respective compositions of the lower barrier layer and the lower well layer are not particularly limited, and it suffices that the lower well layer has a smaller bandgap energy than the lower barrier layer. Also, the lower barrier layer is preferably doped with an n-type impurity, and the lower well layer may be doped with an n-type impurity or may be undoped. Further, an average n-type doping concentration of lower MQW light-emitting layer 113 is preferably higher than an average n-type doping concentration of upper MQW light-emitting layer 114.

Upper MQW light-emitting layer 114 functions as a major light-emitting region, and is formed by stacking an upper barrier layer and an upper well layer. Respective compositions of the upper barrier layer and the upper well layer are not particularly limited, and it suffices that the upper well layer has a smaller bandgap energy than the upper barrier layer.

In such nitride semiconductor light-emitting device 100, V pit generation layer 10 is provided. Therefore, V pit 115 is partly formed in upper MQW light-emitting layer 114, and an average position of starting point of V pit 115 exists in superlattice layer 112 or in lower MQW light-emitting layer 113. Therefore, it is possible to obtain approximately the same effect as that in the above first embodiment.

In the following, concrete examples of the present embodiment will be shown. The present embodiment is not limited to the examples shown below.

<V Pit Evaluation Structure According to Example 3>

After preparing V pit generation layer 10 according to the method shown in Example 1, a wide bandgap layer formed of n-type GaN (thickness 1.75 nm) and a narrow bandgap layer formed of n-type InGaN (thickness 1.75 nm) were stacked (10 cycles). As a result, superlattice layer 112 having a total thickness of 35 nm was obtained.

Subsequently, a lower barrier layer formed of GaN (thickness 4.6 nm) and a lower well layer formed of InGaN (thickness 3.25 nm) were stacked (2 cycles) to obtain lower MQW light-emitting layer 113 having a total thickness of 83 nm. While the lower barrier layer was doped with an n-type impurity, the lower well layer was an undoped layer.

Subsequently, an upper barrier layer formed of GaN (thickness 4.6 nm) and an upper well layer formed of InGaN (thickness 3.25 nm) were stacked (5 cycles), to obtain upper MQW light-emitting layer 114. Both the upper barrier layer and the upper well layer were undoped layers. In this manner, the V pit evaluation structure of Example 3 was obtained, and V pit diameter was measured according to the method described in Example 1, and an average position of starting point of V pit 115 was determined from the obtained V pit diameter. As a result, it was found that an average position of starting point of V pit 115 exists in lower MQW light-emitting layer 113.

Figure 9:
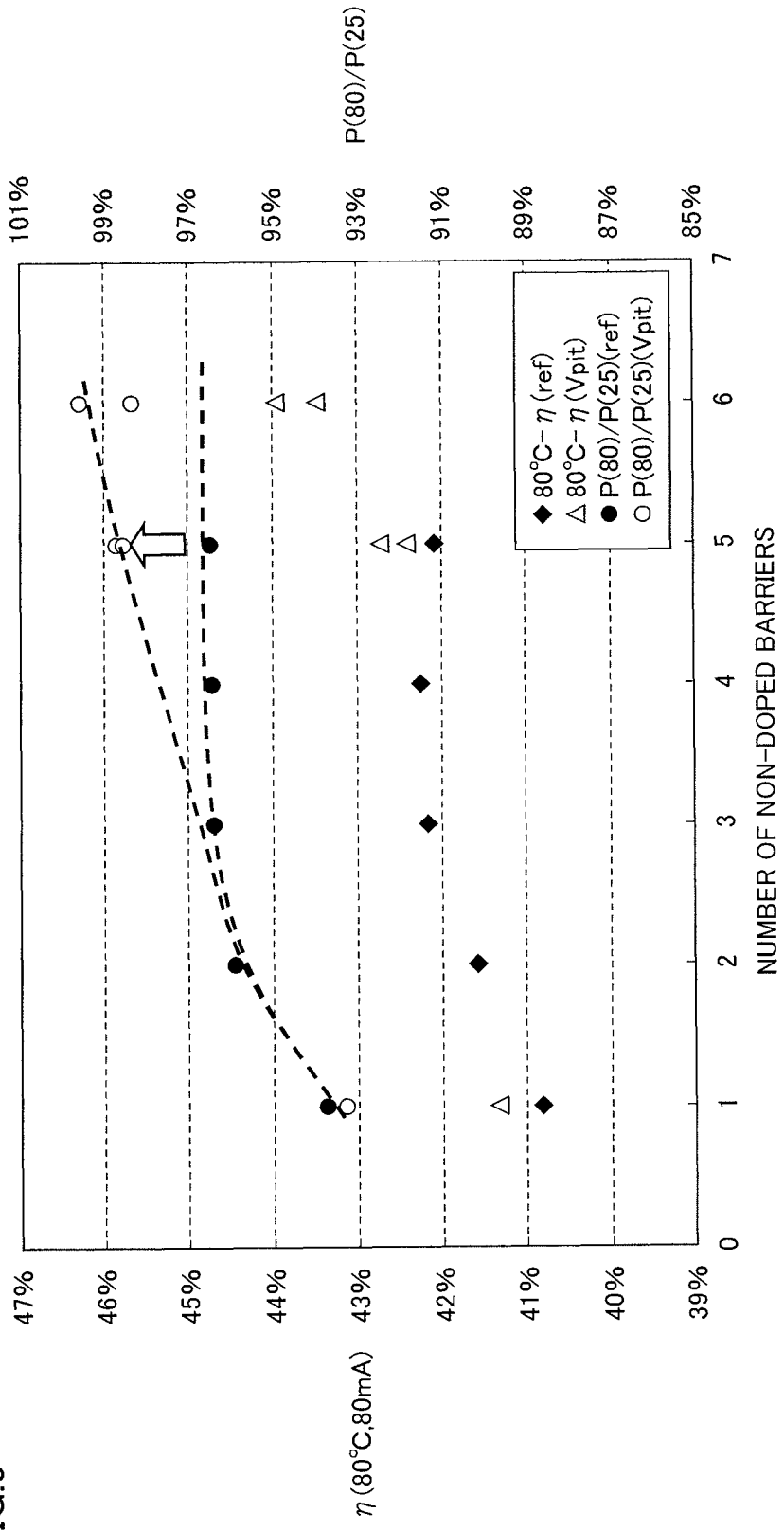
FIG. 9 is a graph showing a relationship between the number of barrier layers in the upper MQW light-emitting layer and external quantum efficiency in one example of the present invention.

Further, in the condition that a total number of the number of upper barrier layers and the number of lower barrier layers, and a total number of the number of upper well layers and the number of lower well layers are respectively constant, the number of barrier layers (Si-non-doped barrier layer) of upper MQW light-emitting layer 114 was changed, and the relationship between the number of barrier layers of upper MQW light-emitting layer 114 and high temperature characteristic was examined. The result is shown in FIG. 9. In FIG. 9, the horizontal axis represents the number of barrier layers (non-doped barrier layer) constituting upper MQW light-emitting layer 114, the left vertical axis represents light emission efficiency at a driving current of 80 mA in an environment at 80° C. [η(80° C., 80 mA)], and the right vertical axis represents a ratio [P (80)/P (25)] between light output at 25° C. P (25) and light output at 80° C. P (80).

As shown in FIG. 9, it was found that in the structure of Example 3, in comparison with the structure of Comparative Example 3 (the structure not provided with V pit generation layer 10), temperature characteristic P (80)/P (25) is particularly improved when the number of barrier layers (Si-non-doped barrier layer) of upper MQW light-emitting layer 114 is greater than or equal to 4 and less than or equal to 6. Also, by extrapolation of the expected temperature characteristic line (broken line on the upper side in FIG. 9), it is estimated that excellent temperature characteristic is obtained even when the number of barrier layers (Si-non-doped barrier layer) of upper MQW light-emitting layer 114 is 7 to 9.

<Fourth Embodiment>

Figure 10:
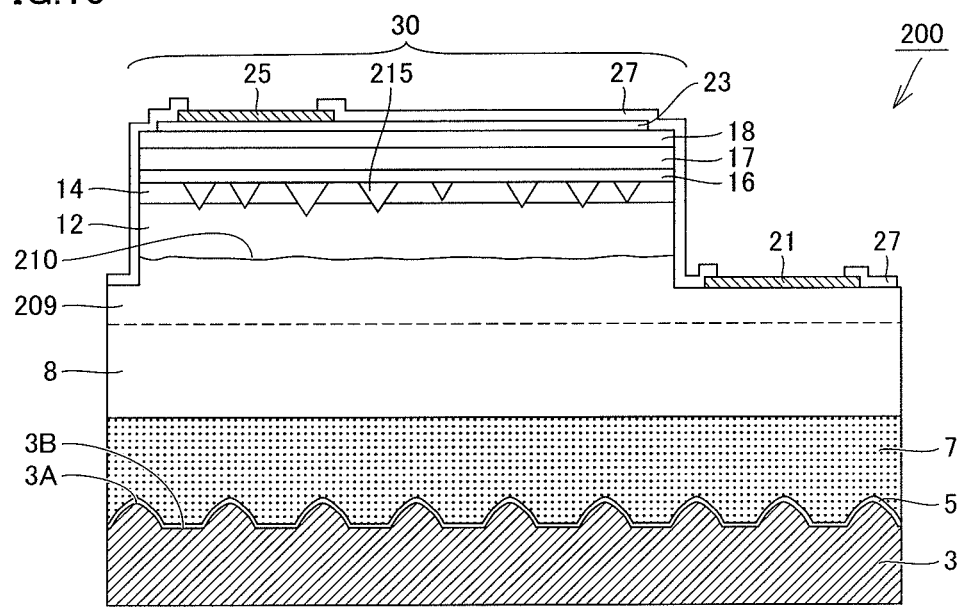
FIG. 10 is a sectional view showing a configuration of a nitride semiconductor light-emitting device according to one embodiment of the present invention.

FIG. 10 is a schematic sectional view of a nitride semiconductor light-emitting device 200 according to the fourth embodiment of the present invention. In the following, difference from the above first embodiment will be mainly described.

As shown in FIG. 10, in nitride semiconductor light-emitting device 200 according to the present embodiment, V pit 15 is generated by controlling the condition of a surface 210 of an n-type nitride semiconductor layer 209 in place of providing V pit generation layer 10. On an upper face of a substrate 3 formed with a projecting portion 3A and a recess portion 3B in the upper face, a buffer layer 5, a base layer 7, n-type nitride semiconductor layers 8, 209, a superlattice layer 12 serving as an intermediate layer, a MQW light-emitting layer 14, and p-type nitride semiconductor layers 16, 17, 18 are sequentially stacked to form a mesa part 30. On the outside of mesa part 30, a part of an upper face of n-type nitride semiconductor layer 209 is exposed without being covered with superlattice layer 12, and on this exposed part, an n-side electrode 21 is provided. On p-type nitride semiconductor layer 18, a p-side electrode 25 is provided with a transparent electrode 23 interposed therebetween. Almost whole of the upper face of nitride semiconductor light-emitting device 200 is provided with a transparent protection film 27 in such a manner that p-side electrode 25 and n-side electrode 21 are exposed. A constituting part similar to that in nitride semiconductor light-emitting device 1 is denoted by the same reference numeral.

<Method for Producing Nitride Semiconductor Light-Emitting Device>

After sequentially forming buffer layer 5, base layer 7, n-type nitride semiconductor layer 8, and n-type nitride semiconductor layer 209 on substrate 3, supply of a source gas for preparing n-type nitride semiconductor layer 209 is stopped. As a result, growth of n-type nitride semiconductor layer 209 stops.

Then, the temperature of the wafer is lowered while the wafer formed with n-type nitride semiconductor layer 209 or the like is supplied with a gas significantly containing hydrogen gas as a carrier gas. As a result, the surface condition of upper face 210 of n-type nitride semiconductor layer 209 changes. Therefore, as shown in the above first embodiment, V pit 15 having an average position of starting point located in superlattice layer 12 can be formed in MQW light-emitting layer 14.

Here, the gas significantly containing hydrogen gas preferably contains greater than or equal to 10% by volume of hydrogen gas, and more preferably contains greater than or equal to 20% by volume and less than or equal to 80% by volume of hydrogen gas. When less than 10% by volume of hydrogen gas is contained, it may be impossible to sufficiently change the surface condition of upper face 210 of n-type nitride semiconductor layer 209. On the other hand, when greater than 90% by volume of hydrogen gas is contained, the surface condition of upper face 210 of n-type nitride semiconductor layer 209 may excessively change, and a trouble of deteriorating light emission efficiency in MQW light-emitting layer 14 may be caused. The gas significantly containing hydrogen gas preferably contains at least one of nitrogen gas and rare gas such as argon, in addition to hydrogen gas.

Extent of lowering the temperature of wafer is preferably greater than or equal to 50° C., more preferably greater than or equal to 100° C., and further preferably greater than or equal to 200° C. This is because when the extent of lowering the temperature of wafer is less than 50° C., the surface condition of upper face 210 of n-type nitride semiconductor layer 209 may not be sufficiently changed. On the other hand, when the extent of lowering the temperature of wafer is too large, the surface condition of upper face 210 of n-type nitride semiconductor layer 209 may excessively change, so that a trouble of deteriorating light emission efficiency in MQW light-emitting layer 14 may be caused. Therefore, the extent of lowering the temperature of wafer is preferably less than or equal to 400° C., and more preferably less than or equal to 300° C.

Thereafter, according to the method described in the above first embodiment, superlattice layer 12, MQW light-emitting layer 14, p-type nitride semiconductor layer 16, p-type nitride semiconductor layer 17, and p-type nitride semiconductor layer 18 are sequentially formed, and after conducting predetermined etching, n-side electrode 21, transparent electrode 23, p-side electrode 25, and transparent protection film 27 are formed.

As described above, in the present embodiment, during the term after formation of n-type nitride semiconductor layer 209 and before formation of superlattice layer 12, a treatment that deteriorates quality of a crystal on upper face 210 of n-type nitride semiconductor layer 209 is conducted. Therefore, crystallinity of MQW light-emitting layer 14 deteriorates. Therefore, V pit 15 is formed in MQW light-emitting layer 14, and an average position of starting point of V pit 15 is located in superlattice layer 12. As a result, it is possible to obtain approximately the same effect as that in the above first embodiment without providing a V pit generation layer.

In the following, concrete examples of the present embodiment will be shown. The present embodiment is not limited to the examples as shown below.

<V Pit Evaluation Structure in Example 4>

After preparing n-type nitride semiconductor layer 8 according to the method described in Example 1, the temperature of the wafer was set at 1050° C. (a value measured by a radiation thermometer) and n-type nitride semiconductor layer 209 was allowed to grow. N-type nitride semiconductor layer 209 is formed of n-type GaN having a doping concentration of $6.5 \times 10^{18}$ cm$^{-3}$, and the thickness was 1.5 μm. Here, as a carrier gas, $N_2:H_2=42\%:58\%$ (volume ratio) was used.

After growth of n-type nitride semiconductor layer 209, growth of nitride semiconductor light-emitting device 200 was interrupted and the temperature was lowered. Here, conventionally, from the concern about etching on the surface of an n-type nitride semiconductor layer by hydrogen, interruption of growth of the nitride semiconductor light-emitting device and lowering of the temperature were conducted after stopping the hydrogen flow. In contrast to this, in the present example, supply of TMG and $SiH_4$ which are source gases for n-type nitride semiconductor layer 209 was interrupted, and ingredients of the carrier gas were made $N_2:H_2=59\%:41\%$ (at the start of lowering the temperature) while $NH_3$ was kept flowing, and the temperature setting of the wafer was lowered to 820° C. However, a time of about 450 seconds was required for the temperature of the wafer to actually reach the set value (820° C.). After the temperature of the wafer reached the set value, the wafer was retained for another 1350 seconds, and growth was interrupted for a total of 1800 seconds.

Figure 11A:
FIG. 11A is an image obtained by AFM observation of an upper face of a V pit evaluation structure in one comparative example.
Figure 11B:
FIG. 11B is an image obtained by AFM observation of an upper face of a V pit evaluation structure in one example.

Surface 210 of n-type nitride semiconductor layer 209 thus obtained was observed under AFM. FIG. 11A is a result of the case where the temperature of the wafer was lowered without supply of hydrogen gas (Comparative Example 4), and FIG. 11B is a result of Example 4. The results shown in FIG. 11A to FIG. 11B are results of samples for evaluation that are obtained by interrupting growth of the nitride semiconductor light-emitting device and lowering the temperature after growth of n-type nitride semiconductor layer 209 and then lowering the temperature to normal temperature, followed by removal from the MOCVD apparatus.

In Example 4, compared with Comparative Example 4, a step structure that appears at the time of excellent crystal growth disappeared and a hole that is an origin of V pit 15 was observed.

On surface 210 of n-type nitride semiconductor layer 209, superlattice layer 12 functioning as an intermediate layer and MQW light-emitting layer 14 were allowed to grow to prepare a V pit evaluation structure, and density of V pits 15 in the upper face of the V pit evaluation structure was evaluated by an AFM method. In Example 4, the number of pits in the AFM observation area of 5 μm in length and width was 130 ($5.2 \times 10^8$ cm$^{-2}$), and in Comparative Example 4, the number of pits in the above area was 16 ($6.4 \times 10^7$ cm$^{-2}$). The number density of V pits 15 significantly increased in Example 4 than in Comparative Example 4. Also V pit diameter was measured, and an average position of starting point of V pit 15 was in superlattice layer 12 in Example 4.

Also, V pit evaluation structures were prepared with four levels of $H_2$ partial pressure $(H_2/N_2+H_2)=41\%$, 58%, 65%, 70% in the carrier gas, and V pit diameter in the surface of MQW light-emitting layer 14 was compared. As a result, V pit diameter was largest when $H_2$ partial pressure was 58%.

While description has been made for embodiments and examples of the present invention, it is initially planned to appropriately combine configurations of individual embodiments and examples.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light-emitting device comprising an n-type nitride semiconductor layer, a V pit generation layer, an intermediate layer, a multiple quantum well light-emitting layer, and a p-type nitride semiconductor layer provided in this order, wherein
said multiple quantum well light-emitting layer is a layer formed by alternately stacking a barrier layer and a well layer having a bandgap energy smaller than that of the barrier layer,
a V pit is partly formed in said multiple quantum well light-emitting layer, and
an average position of starting point of said V pit is located in said intermediate layer.

2. A nitride semiconductor light-emitting device comprising an n-type nitride semiconductor layer, a V pit generation layer, an intermediate layer, a lower multiple quantum well light-emitting layer, an upper multiple quantum well light-emitting layer, and a p-type nitride semiconductor layer provided in this order, wherein
said upper multiple quantum well light-emitting layer is a layer formed by alternately stacking an upper barrier layer and an upper well layer having a bandgap energy smaller than that of the upper barrier layer,
said lower multiple quantum well light-emitting layer is a layer formed by alternately stacking a lower barrier layer and a lower well layer having a bandgap energy smaller than that of the lower barrier layer, and at least said lower barrier layer is doped with an n-type impurity,
an average n-type doping concentration of said lower multiple quantum well light-emitting layer is higher than an average n-type doping concentration of said upper multiple quantum well light-emitting layer,
a V pit is partly formed in said upper multiple quantum well light-emitting layer, and
an average position of starting point of said V pit is located in said intermediate layer or in said lower multiple quantum well light-emitting layer.

3. The nitride semiconductor light-emitting device according to claim 1 or 2, wherein n-type doping concentration in said V pit generation layer is significantly higher than n-type doping concentration in the uppermost surface of said n-type nitride semiconductor layer.

4. The nitride semiconductor light-emitting device according to claim 3, wherein n-type doping concentration in said V pit generation layer is greater than or equal to $5 \times 10^{18}$ cm$^{-3}$.

5. The nitride semiconductor light-emitting device according to claim 1 or 2, wherein an In composition rate in said V pit generation layer is higher than an In composition rate in the uppermost surface of said n-type nitride semiconductor layer.

6. The nitride semiconductor light-emitting device according to claim 5, wherein
said V pit generation layer contains an n-type impurity, and
said V pit generation layer has a composition of $In_xGa_{1-x}N$ ($0.1 \leq x \leq 0.2$).

7. The nitride semiconductor light-emitting device according to claim 1 or 2, wherein thickness of said V pit generation layer is greater than or equal to 5 nm.

8. The nitride semiconductor light-emitting device according to claim 1 or 2, wherein thickness of said intermediate layer is greater than or equal to 40 nm.

9. The nitride semiconductor light-emitting device according to claim 1 or 2, wherein said intermediate layer is a layer formed by alternately stacking a wide bandgap layer and a narrow bandgap layer having a bandgap energy smaller than that of the wide bandgap layer.

10. The nitride semiconductor light-emitting device according to claim 2, wherein the number of barrier layers in said upper multiple quantum well light-emitting layer is greater than or equal to 4.

* * * * *